United States Patent [19]

Ovshinsky et al.

[11] Patent Number: 4,492,181
[45] Date of Patent: Jan. 8, 1985

[54] APPARATUS FOR CONTINUOUSLY PRODUCING TANDEM AMORPHOUS PHOTOVOLTAIC CELLS

[75] Inventors: Herbert C. Ovshinsky, Oak Park; Masatsugu Izu, Birmingham, both of Mich.

[73] Assignee: Sovonics Solar Systems, Solon, Ohio

[21] Appl. No.: 359,825

[22] Filed: Mar. 19, 1982

[51] Int. Cl.$^3$ ............................................. C23C 13/10
[52] U.S. Cl. .................... 118/718; 118/719; 118/723; 118/733
[58] Field of Search ................ 118/718, 723, 45, 719, 118/733, 50.1, 729; 427/38, 39, 255.5, 255.7, 255.2, 255.1; 242/67.3 R; 226/92

[56] References Cited

U.S. PATENT DOCUMENTS

| | | | |
|---|---|---|---|
| 2,862,705 | 12/1958 | Faeber | 226/92 |
| 3,083,926 | 4/1963 | Herr | 242/67.3 R |
| 4,015,558 | 4/1977 | Small et al. | 118/719 X |
| 4,369,730 | 1/1983 | Izu et al. | 118/715 X |
| 4,438,723 | 3/1984 | Cannella et al. | 118/719 X |

Primary Examiner—John D. Smith
Assistant Examiner—Bernard F. Plantz
Attorney, Agent, or Firm—Marvin S. Siskind; Lawrence G. Norris

[57] ABSTRACT

A method and a multiple chamber apparatus for the continuous production of tandem, amorphous, photovoltaic solar cells on substrate material, whereby, at least six amorphous layers are continuously and sequentially deposited on the substrate material under steady conditions. The substrate material is driven from a supply core, through at least two triads of deposition chambers, to a take-up core. Each amorphous layer of each p-i-n-type cell is produced in one chamber of the triad of deposition chambers. In the first chamber of each triad of chambers, dopant gases are introduced to deposit a first conductive layer. In the second chamber of each triad of chambers, reaction gases are introduced to deposit an intrinsic layer atop the first layer. And in the third chamber of each triad of chambers, dopant gases are introduced to deposit a second conductive layer, opposite in conductivity from the first conductive layer, atop the intrinsic layer. The multiple chamber apparatus is constructed to substantially prevent (1) the dopant gases in the first or third chamber from contaminating the intrinsic reaction gases in the second chamber of each triad of deposition chambers; and (2) the dopant gases in the third chamber of one triad of deposition chambers and the dopant gases in the first chamber of an adjacent triad of deposition chambers from cross-contamination. In the preferred embodiment, the intrinsic material is an amorphous silicon alloy which is doped by boron to form a p-type alloy and doped by phosphorous to form an n-type alloy. The preferred embodiment further contemplates the use of a glow discharge deposition process wherein vacuum pressure conditions, temperature levels, reaction gas mixtures, reaction gas flow rates, cathode power generation levels, and substrate speed of travel are precisely controlled.

21 Claims, 11 Drawing Figures

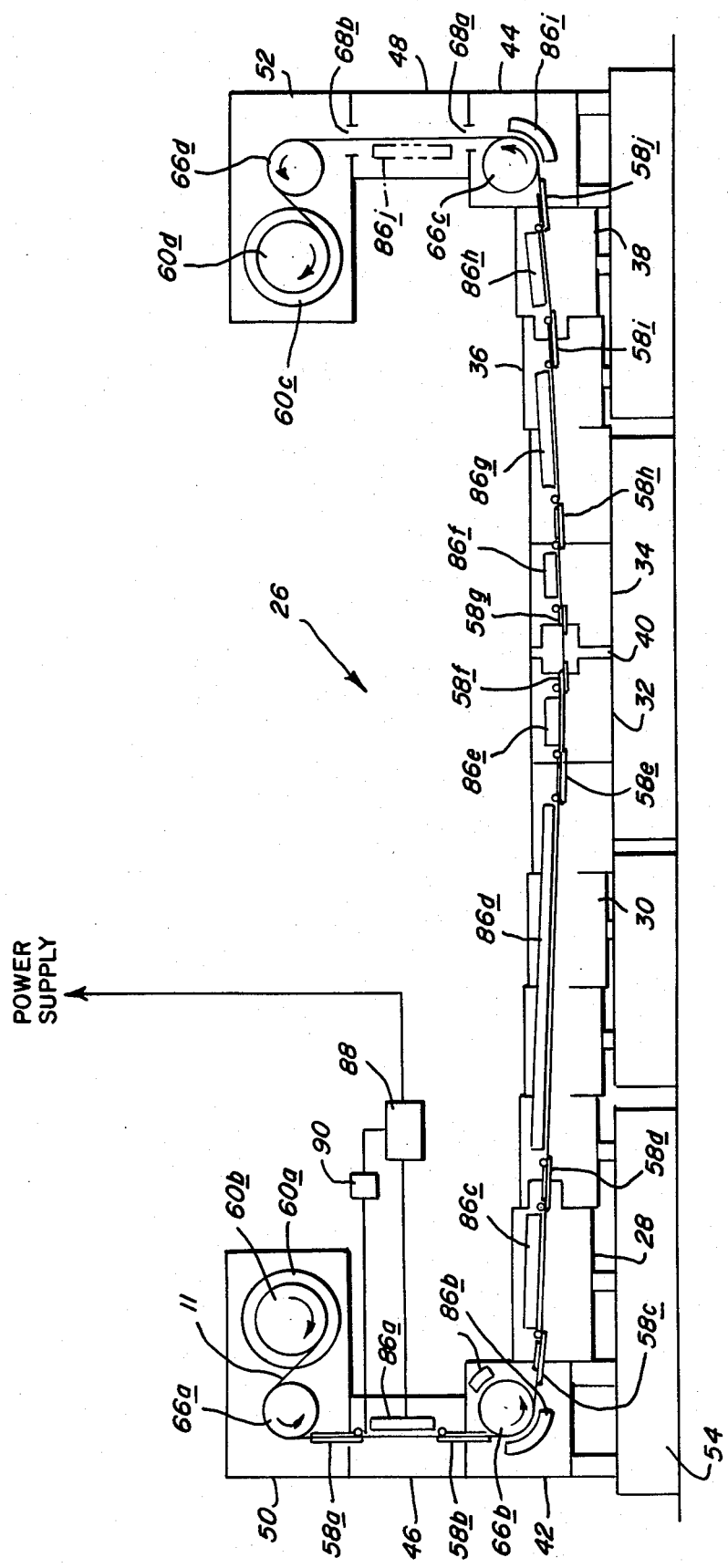

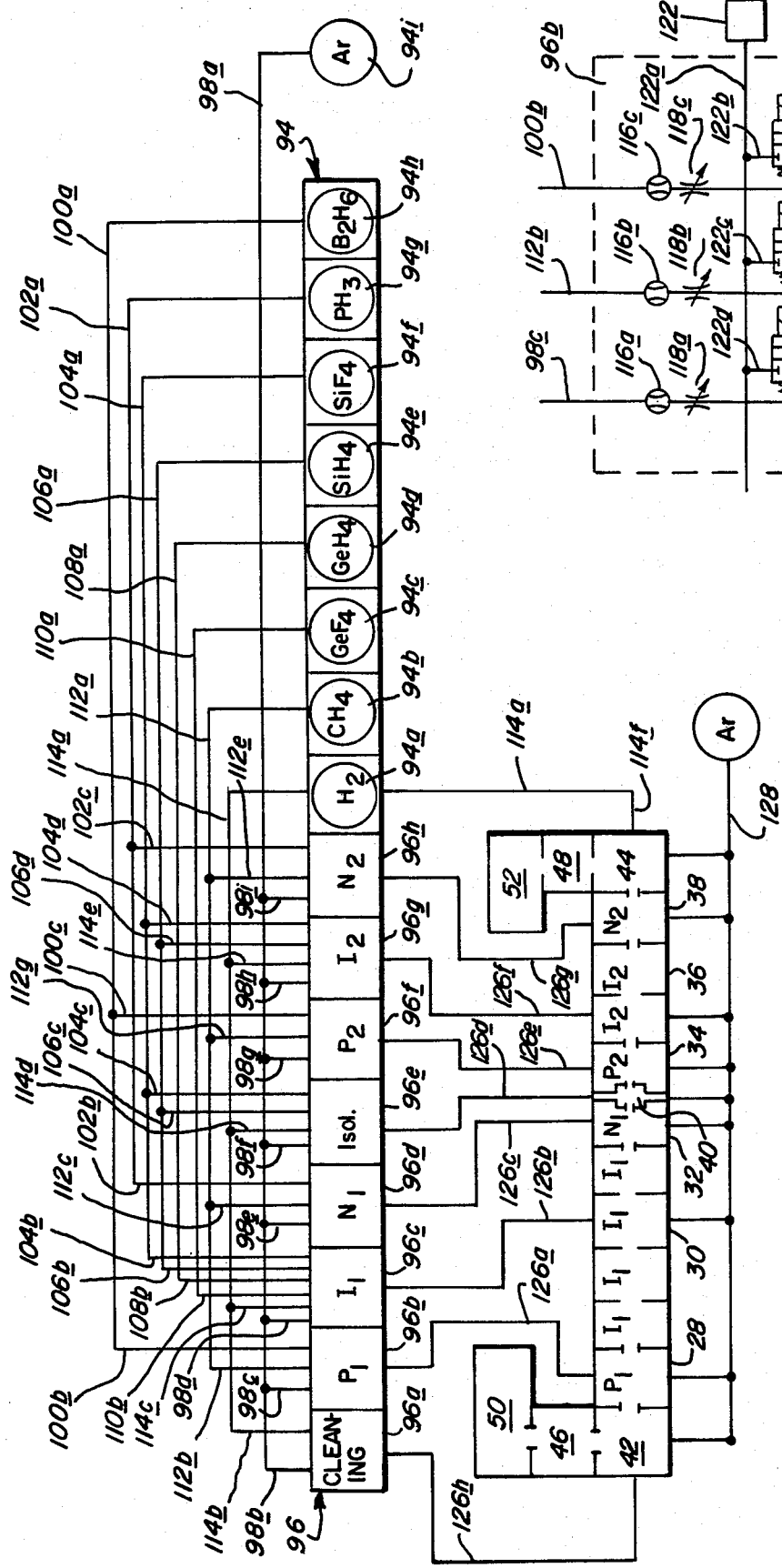
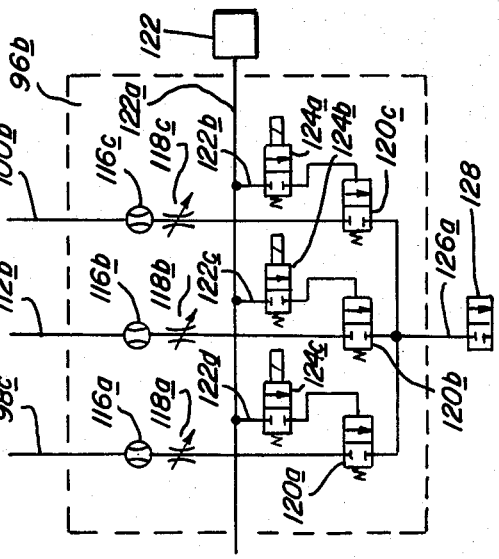
FIG. 6
FIG. 6A

APPARATUS FOR CONTINUOUSLY PRODUCING TANDEM AMORPHOUS PHOTOVOLTAIC CELLS

FIELD OF THE INVENTION

The present invention relates generally to methods and apparatus for producing photovoltaic devices and more particularly to a method and apparatus for the high volume production of tandem p-i-n-type solar cells by depositing layers of amorphous semiconductor alloys of varying electrical properties onto substrate material as the substrate material is continuously and sequentially advanced through a plurality of dedicated deposition chambers.

BACKGROUND OF THE INVENTION

This invention relates to a method and apparatus for producing solar cells by depositing layers of amorphous semiconductor materials of varying electrical conductivity onto a web of substrate material as the substrate material is continuously advanced through a series of dedicated deposition chambers. The deposition of each layer occurs in a separate glow discharge chamber wherein isolation of preselected reaction gas mixtures which form the amorphous layers eliminates cross-contamination therebetween. The substrate is preferrably formed of stainless steel and is fed sequentially and continuously through the dedicated chambers to have deposited thereon two or more band gap-adjusted, amorphous, photoresponsive alloy cells such as a plurality of p-i-n-type solar cells. This invention has its most important application in the mass production of tandem band gap adjusted, amorphous silicon alloy, photoresponsive, high efficiency solar cells.

Recently, considerable efforts have been made to develop processes for depositing amorphous semiconductor alloys, each of which can encompass relatively large areas, and which can be doped to form p-type and n-type materials for the production of p-i-n-type devices substantially equivalent to those produced by their crystalline counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films wherein silane ($SiH_4$) gas is passed through a reaction tube where the gas is decomposed by an radio frequency (r.f.) glow discharge and deposited on a substrate at a substrate temperature of about 500–600 degrees K. (227–327 degrees C.). The material so deposited on the substrate is an intrinsic amorphous material consisting of silicon and hydrogen. To produce a doped amorphous material, phosphine gas ($PH_3$), for n-type conduction, or diborane ($B_2H_6$) gas, for p-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare greatly improved amorphous silicon alloys, that have significantly reduced concentrations of localized states in the energy gaps thereof, while providing high quality electronic properties by glow discharge. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized states therein and facilitates the addition of other alloying materials, such as germanium.

Activated fluorine readily diffuses into, and bonds to, amorphous silicon in a matrix body to substantially decrease the density of localized defect states therein. This is because the small size of the fluorine atoms enables them to be readily introduced into an amorphous silicon matrix. The fluorine bonds to the dangling bonds of the silicon and forms a partially ionic stable bond with flexible bonding angles, which results in a more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and having highest electronegativity.

Compensation may be achieved with fluorine, alone or in combination with hydrogen, upon the addition of such element(s) in very small quantities (e.g., fractions of one atomic percent). However, the amounts of fluorine and hydrogen most desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defect states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is an organizer of local structure in the silicon-containing alloy through inductive and ionic effects. Fluorine also influences the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is increased without substantially decreasing the short circuit current.

Many publications on crystalline stacked cells following Jackson have been reported and, more recently, several articles dealing with Si-H materials in stacked cells have been published. Marfaing proposed utilizing silane deposited amorphous Si-Ge alloys in stacked cells, but did not report the feasibility of doing so. (Y. Marfaing, Proc. 2nd European) Communities Photovoltaic Solar Energy Conf., Berlin, West Germany, p. 287, (1979).

Hamakawa et al, reported the feasibility of utilizing Si-H in a configuration which will be defined herein as a cascade type multiple cell. The cascade cell is hereinafter referred to as a multiple cell without a separation or insulating layer there between. Each of the cells was made of an Si-H material of the same band gap in a p-i-n junction configuration. Matching of the short circuit current ($J_{sc}$) was attempted by increasing the thickness of the cells in the serial light path. As expected, the overall device Voc. increased and was proportional to the number of cells.

In a recent report on increasing the cell efficiency of multiple-junction (stacked) solar cells of amorphous silicon deposited from silane in the above manner, it was reported that "(g)ermanium has been found to be a deleterious impurity in Si:H, lowering its Jsc exponentially with increasing Ge . . . . " From their work, as well as the work of Carlson, Marfaing and Hamakawa, they concluded that alloys of amorphous silicon, germanium and hydrogen "have shown poor photovoltaic properties" and thus new "photovoltaic film cell materials must be found having spectral response at about 1 micron for efficient stacked cell combinations with a Si:H." (J. J. Hanak, B. Faughnan, V. Korsun, and J. P. Pellican, presented at the 14th IEEE Photovoltaic Specialists Conference, San Diego, Calif., Jan. 7-10, 1980).

Due to the beneficial properties attained by the introduction of fluorine, amorphous alloys used to produce cascade type multiple cells now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell alloy maintains high electronic qualities and photoconductivity when the adjusting element(s) are added to tailor the device wavelength characteristics for a specific photoresponse application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce solar cells. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386 filed Mar. 16, 1981 for Continuous Systems For Depositing Amorphous Semiconductor Material; Ser. No. 240,493 filed Mar. 16, 1981 for Continuous Amorphous Solar Cell Production System; and Ser. No. 306,146 filed Sept. 25, 1981, now U.S. Pat. No. 4,438,723 for Multiple Chamber Deposition and Isolation system and Method. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n type amorphous silicon alloy. Since each deposited alloy, and especially the intrinsic alloy must be of high purity, the deposition environment in the intrinsic deposition chamber is isolated from the doping constituents within the other chambers to prevent the diffusion of doping constituents into the intrinsic chamber. In the previously mentioned patent applications, wherein the systems are primarily concerned with the production of photovoltovic cells, isolation between the chambers is accomplished either by employing gas gates which pass an inert gas over the substrate as it passed from one chamber to the next; or by gas gates which establish unidirectional flow of the reaction gas mixture introduced into one of the adjacent chambers into the other of the chambers. However, none of those prior art systems attempt to produce tandem solar cells in a high volume, continuous processing system.

The many objects and advantages of the present invention will become clear from the drawings, the detailed description of the invention and the claims which follow.

BRIEF SUMMARY OF THE INVENTION

There is disclosed herein multiple chamber deposition apparatus for continuously producing under steady state conditions tandem, amorphous, photovoltaic solar cells having a p-i-n-type configuration. The apparatus is adapted to sequentially and continuously pass either an elongated web of substrate material or a substrate plate carried by a conveyor belt through each of at least six operatively and physically connected deposition chambers. Each deposition chamber includes a conduit through which a preselected reaction gas mixture is introduced into the chamber, and a mechanism for depositing successive amorphous alloy layers onto the deposition surface of the substrate, so that the composition of each amorphous alloy layer will depend upon the gas mixture introduced into the chamber. By employing a continuous processing technique, it is no longer necessary to sequentially initiate and terminate plasma and gas flow for depositing each amorphous alloy layer. Therefore, the present invention not only improves productivity, but also improves the quality of the layers and reduces fluctuations due to start-up and shut-down conditions.

In the preferred embodiment of the invention, the first layer deposited on the substrate will be an amorphous p-type conductivity layer, the second layer deposited on the substrate will be an amorphous intrinsic alloy layer and the third layer deposited on the substrate will be an amorphous n-type conductivity layer. The second and each succeeding one of the tandem p-i-n-type cells deposited on the substrate material will be band gap adjusted to match generated currents and to increase open circuit voltage, while maintaining the p-i-n-configuration.

Since different reaction gases are introduced in each one of the triad of deposition chambers, gas gates are provided between each adjacent chamber to prevent cross-contamination. An isolation chamber is positioned between the p-type and n-type chambers of adjacent triads of deposition chambers to similarly prevent cross-contamination therebetween.

In the preferred embodiment, two triads of deposition chamber (a total of six chambers) are provided to produce two tandem solar cells. The two triads have introduced thereinto: at least a silicon containing gas into the second and fifth deposition chambers; at least a silicon containing gas and a gas containing a p-dopant into the first and fourth deposition chambers; and at least a silicon containing gas and a gas containing an n-dopant into the third and sixth deposition chambers. Band gap adjusting elements, such as carbon or germanium, may be added to the silicon alloy layers to adjust the light absorption characteristics of each layer. In the preferred embodiment, the band gap of the amorphous, dopant layers is widened by the addition of carbon and the band gap of the lowermost intrinsic layer is narrowed by the addition of germanium. Other band gap adjusting elements include oxygen, nitrogen and tin.

Other significant structural features of the present invention include an automatic threader for forwarding a web of substrate material from a position adjacent the first deposition chamber to a position adjacent the final deposition chamber; and an interleaf assembly for removing protective sheeting from between adjacent layers of the web of substrate material wound on the substrate supply core, and introducing protective sheeting between adjacent layers of the web of substrate materials as it is wound onto the substrate take-up core after the deposition processes have been completed.

Also disclosed herein, is the method of continuously producing at least two stacked, amorphous photovoltaic solar cells onto the surface of substrate material adapted to continuously move through a series of at least six dedicated deposition chambers, wherein reaction gas mixtures of varying electrical conductivity are introduced into the deposition chambers for depositing successive p-type, intrinsic, and n-type amorphous semiconductor layers onto the substrate. The method comprises at least the steps of: effecting a vacuum in the chambers through which the substrate moves; heating the chambers to warm the substrate and reaction gas mixtures; introducing the reaction gas mixtures into the chambers in such a manner that (1) the intrinsic gas mixture is not contaminated by adjacent n-dopant or p-dopant gas mixtures, and (2) adjacent n-dopant and p-dopant gas mixtures do not cross-contaminate; decomposing the gas mixtures in the deposition chambers to form a plasma; moving the substrate through the deposition chambers in the plasma region for depositing the decomposed gas mixtures onto the substrate; and maintaining the substrate temperature, the speed of substrate level, the substrate tension, the mixtures of reaction gases, the pressure differentials between adjacent chambers, and the vacuum pressures, whereby tandem, amorphous, photovoltaic solar cells are continuously produced on the web of substrate material.

BRIEF DESCRIPTION OF THE DRAWINGS

FIG. 4 is diagrammatic representation of the multiple-chamber deposition apparatus of the present invention showing the gas gates, the substrate stretching from the supply chamber to the take-up chamber, the heating elements, and the controls for establishing and maintaining the selected temperature for the heating elements;

FIG. 6 is a diagrammatic representation of the multiple chamber deposition apparatus of the present invention illustrating the feed conduits and the valving assemblies employed to proportion and introduce the reaction gases into the chambers;

FIG. 6A is an enlarged diagrammatic representation of the general valving system common to all of the compartments of the process gas manifolds illustrated in FIG. 6;

DETAILED DESCRIPTION OF THE DRAWINGS

I. The Product

Figure 1:
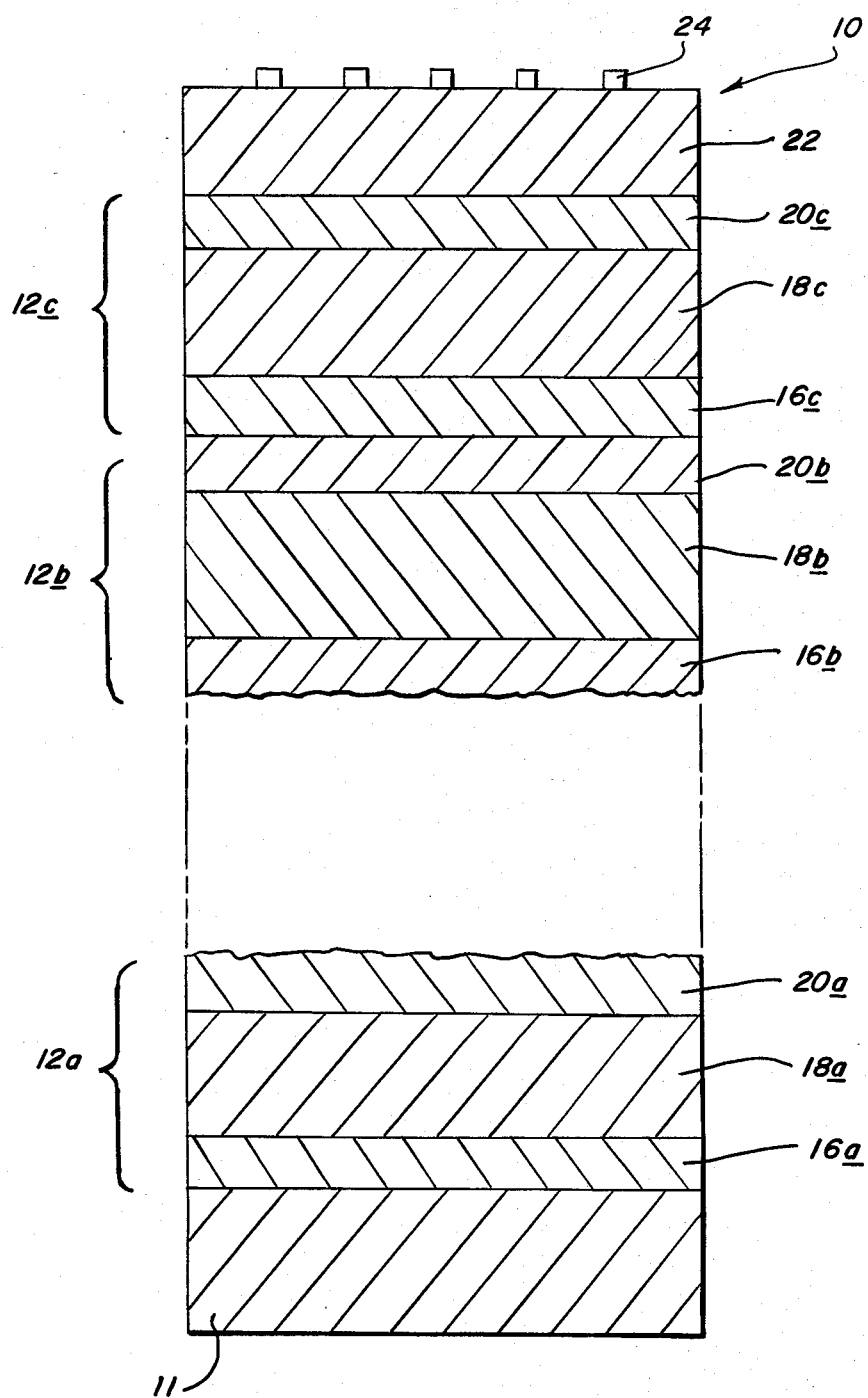
FIG. 1 is a fragmentary, cross-sectional view of a tandem or cascade photovoltaic device comprising a plurality of p-i-n-type cells, each layer of the cells formed from an amorphous, semi-conductor alloy in accordance with the present invention.

Referring now to the drawings and particularly to FIG. 1, a tandem or cascade type, photovoltaic cell, formed of successive p-i-n layers each including an amorphous semi-conductor alloy, is shown generally by the numberal 10. It is for the continuous production of this type of photovoltaic cell wherein amorphous alloy layers are successively deposited onto a moving substrate, that the multiple chamber apparatus of the present invention was constructed.

More particularly, FIG. 1 shows a plurality of p-i-n-type photovoltaic devices such as solar cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous material, for purposes of this application, the term "substrate" shall include not only a flexible film, but also any elements added thereto by preliminary processing. Most commonly the substrate material 11 may be stainless steel, aluminum, tantalum, molybdenum or chrome.

Each of the cells 12a, 12b and 12c include an amorphous alloy body containing at least a silicon alloy. Each of the alloy bodies includes an n-type conductivity region or layer 20a, 20b, and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, this invention is equally adapted to produce tandem n-i-p multiple cells by simply reversing the order of depositing the n-type and p-type layers onto the substrate.

For each of the cells 12a, 12b and 12c, the p-type layers are characterized by light absorptive, high conductivity alloy layers. The intrinsic alloy layers are characterized by an adjusted wave length threshold for solar photoresponse, high light absorption, low dark conductivity and high photoconductivity, including sufficient amounts of a band gap adjusting element or elements to optimize the band gap for the particular cell application. Preferably, the intrinsic layers are band gap adjusted to provide cell 12a with the lowest band gap, cell 12c with the highest band gap, and cell 12b with a band gap between the other two. The n-type layers are characterized by low light absorption, high conductivity alloy layers. The thickness of the n-type layers can be in the range of about 25 to 100 angstroms. The thickness of the band gap adjusted, amorphous intrinsic alloy layers can be between about 2,000 to 3,000 angstroms. The thickness of p-type layers can be between 50 to 200 angstroms. Due to the shorter diffusion length of the holes, the p-type layers generally will be as thin as possible. Further, the outermost layer, here the n-type layer 20c, will be as thin as possible to avoid absorption of light and need not include the band gap adjusting element.

The method and apparatus of the present invention, wherein amorphous semi-conductor alloy layers are deposited onto a substrate, will now be described with reference to the remaining drawings. However, it is to be understood that following the deposition of the semi-conductor alloy layers, a further deposition step may be performed in a separate environment. In this step, a TCO (transparent conductive oxide) layer 22 is added, which layer may, for example, be indium tin oxide (ITO), cadmium stannate ($Cd_2SnO_4$), or doped tin oxide ($SnO_2$).

An electrode grid 24 may be added to the device. For a tandem cell having a sufficiently small area, the TCO layer 22 is generally sufficiently conductive so the grid 24 is not necessary. If the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Chamber Apparatus

A. General Arrangement of Chambers

Figure 2:
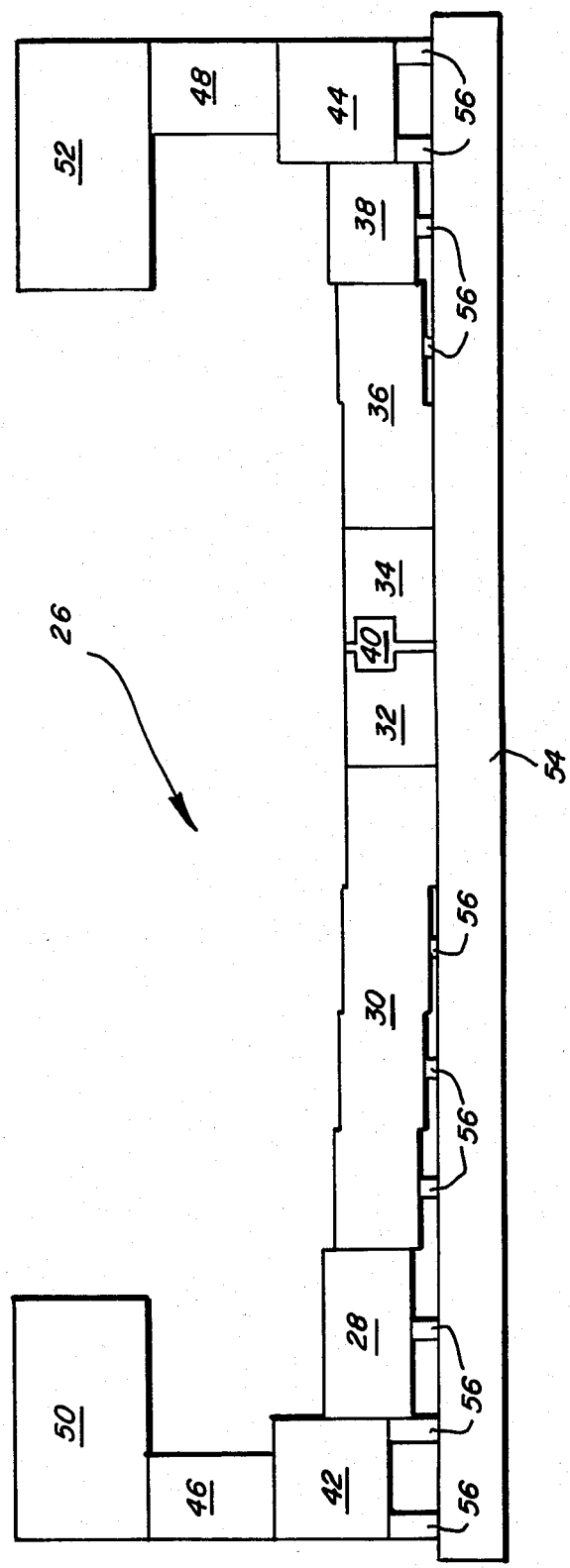
FIG. 2 is a diagrammatic representation of a multiple deposition chamber apparatus adapted to continually produce amorphous, stacked photovoltaic cell devices in accordance with the present invention.

Turning now to FIG. 2, a diagrammatic representation of a multiple glow discharge chamber deposition apparatus for the continuous production of tandem or cascade photovoltatic cells is illustrated by the reference numberal 26. The apparatus 26 includes a plurality of isolated and dedicated deposition chambers in accordance with the principles of the present invention.

The apparatus is adapted to produce a high volume of large area, amorphous photovoltaic stacked cells having a p-i-n configuration on the deposition surface of a substrate material which is continually fed therethrough. To deposit the amorphous alloy layers required for producing a tandem cell of the p-i-n configuration, the apparatus 26 includes: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the depositon surface of the substrate 11 as the substrate 11 passes therethrough; a third deposition chamber 32 in which an n-type conductivity alloy layer is deposited atop the intrinsic layer on the deposition surface of the substrate 11 as the substrate 11 passes therethrough; a fourth deposition chamber 34 in which a second p-type conductivity amorphous alloy layer is deposited atop the n-type alloy layer on the depositon surface of the substrate 11 as the substrate 11 passes therethrough; a fifth deposition chamber 36 in which a second intrinsic amorphous alloy layer is deposited atop the second p-type alloy layer on the deposition surface of the substrate 11 as the substrate passes therethrough; and a sixth deposition chamber 38 in which a second n-type conductivity amorphous alloy layer is deposited atop the second intrinsic alloy layer on the deposition surface of the substrate 11 as the substrate 11 passes therethrough.

It should be apparent that, although six deposition chambers (two triads of the three deposition chambers) have been described, additional chambers may be added to the machine to provide the machine with the capability of producing any number of tandem photovoltaic cells having a p-i-n or n-i-p configuration. It is to be understood that, although, in the preferred embodiment, the substrate material is a continuous web, the concept of the present invention is equally adapted for depositing successive layers atop discrete substrate plates continuously fed through the plurality of deposition chambers. It should also be apparent that, since the length of the path of travel of the substrate through individual deposition chambers is proportional to the thickness of the p-type or intrinsic or n-type layer deposited in a given chamber, the length of the path of travel of the substrate through an individual deposition chamber may be increased or decreased to deposit on the substrate a layer of desired thickness. As an example of the foregoing, the length of the path of travel of the substrate 11 through the second deposition chamber 30 wherein the first intrinsic alloy layer is deposited is approximately twice the length of the path of travel of the substrate 11 through the fifth deposition chamber wherein the second intrinsic alloy layer is deposited, thereby producing a much thicker first intrinsic alloy layer than second intrinsic alloy layer. The thicknesses of all of the alloy layers will be discussed hereinafter.

Still referring to FIG. 2, the apparatus 26 further includes an intermediate chamber 40 for isolating the n-type reaction gas mixture flowing through the third deposition chamber 32 and the p-type reaction gas mixture flowing through the fourth deposition chamber 34. Positioned on the side of the first deposition chamber 28 opposite the second deposition chamber 30 and physically contacting the first deposition chamber 28 is a pay-off, substrate-directing chamber 42 and positioned on the side of the sixth deposition chamber 38 opposite the fifth deposition chamber 36 is a post-deposition, substrate-directing chamber 44. Positioned immediately above and physically contacting the pay-off, substrate-directing chamber 42 is a cleaning chamber 46, and positioned immediately above and physically contacting the post-deposition, substrate-directing chamber 44 is a cool-down chamber 48. Finally, positioned immediately above and physically contacting the cleaning chamber 46 is a substrate supply chamber 50 and positioned immediately above and physically contacting the cool-down chamber 48 is a substrate take-off chamber 52.

The multiple chamber apparatus 26, as defined by the plurality of contiguous chambers described hereinabove, is mounted on a rigid framework which includes one or more horizontal base members 54 and a plurality of vertically extending, rigid studs 56 of varying lengths. The studs 56 are adapted to be positioned beneath chambers of the apparatus 26 so that the chambers are supported at a lowermost elevation adjacent the intermediate chamber 40 thereof and the chambers gradually increase in their vertical distance above the base members 54 so as to reach a maximum elevation above the base members 54 at the pay-off, substrate-directing chamber 42 and the post-deposition, substrate-directing chamber 44. By sequentially and gradually staggering the height of the chambers, the web of substrate material 11 passing therethrough is permitted to sag under its own weight and thereby reduce the build up of stress initiated by drive and torque motors pulling the substrate 11 through the chambers.

B. The Gas Gates and Drive Assemblies

Figure 3:
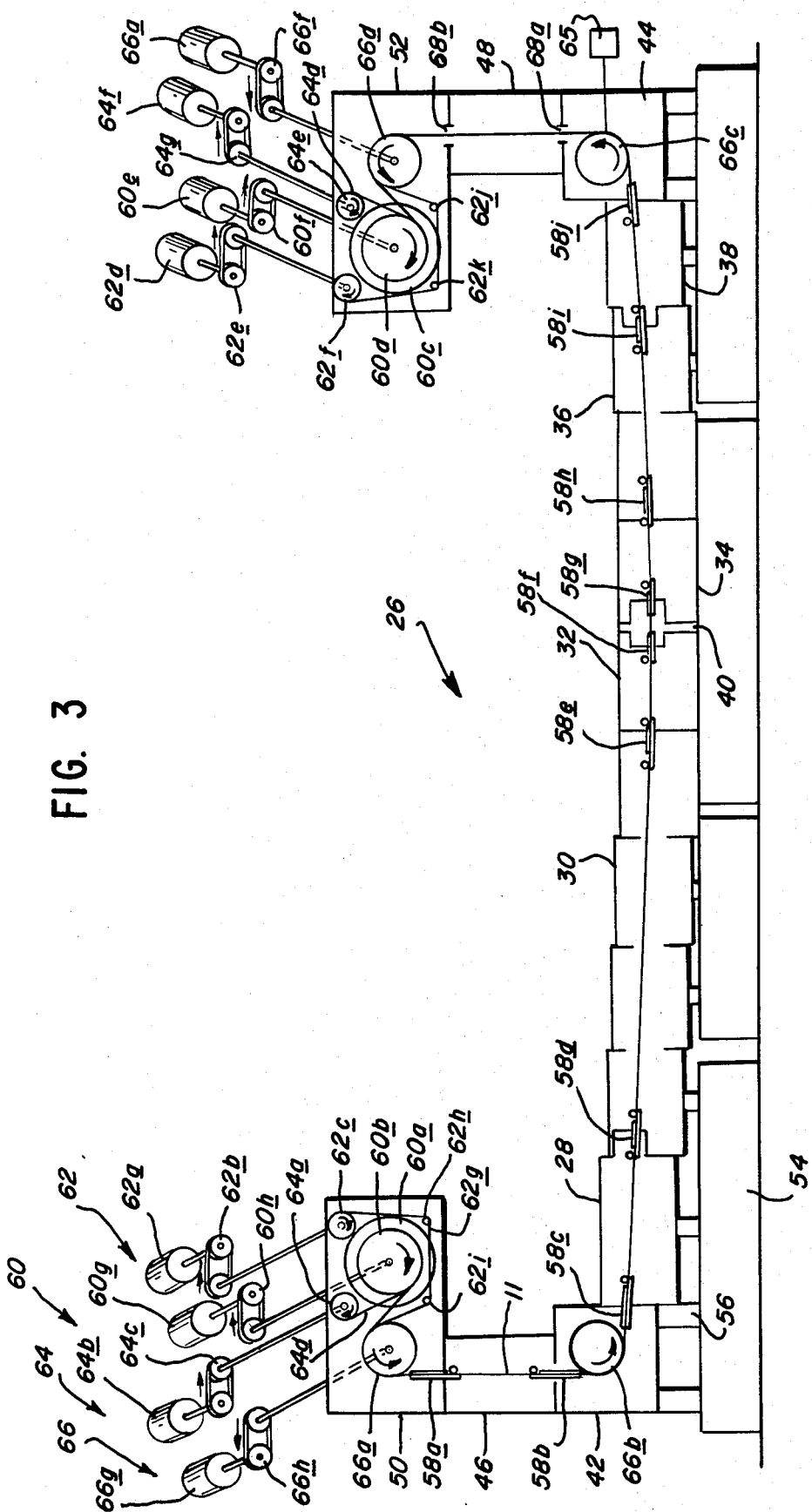
FIG. 3 is a diagrammatic representation of the multiple-chamber deposition apparatus of the present invention, as in FIG. 2, and further showing the gas gates connecting adjacent chambers of the assembly, the substrate supply and take-up assembly, the automatic threader assembly, the interleaf removal and take-up assembly, and the substrate tensioning assembly.

Referring now to FIG. 3, the diagrammatic representation of the multiple chamber apparatus 26 illustrated in FIG. 2 and generally described hereinabove has been duplicated. Added to that diagrammatic representation are the gas gates shown generally as 58a–58j; the substrate supply and take-up assembly shown generally as 60; the automatic threader assembly shown generally as 62; the interleaf assembly shown generally as 64; and the substrate tensioning assembly shown generally as 66. These assemblies will now be described in detail.

The gas gates 58a–58j generally function to provide a small passageway through which the substrate 11 is adapted to continually pass while preventing contamination of the reaction gas mixture of one chamber with the reaction gas mixture of an adjacent chamber. More particularly, the gas gate 58a provides a passageway between the substrate supply chamber 50 and the cleaning chamber 46; the gas gate 58b provides a passageway between the cleaning chamber 46 and the pay-off, substrate-directing chamber 42; the gas gate 58c provides a passageway between the pay-off, substrate-directing chamber 42 and the first deposition chamber 28; gas gate 58d provides a passageway between the first deposition chamber 28 and the second deposition chamber 30; the gas gate 58e provides a passageway between the second deposition chamber 30 and the third deposition chamber 32; the gas gate 58f provides a passageway between the third deposition chamber 32 and the intermediate isolation chamber 40; the gas gate 58g provides a passageway between the intermediate isolation chamber 40 and the fourth deposition chamber 34; the gas gate 58h provides a passageway between the fourth deposition chamber 34 and the fifth deposition chamber 36; the gas gate 58i provides a passageway between the fifth deposition chamber 36 and the sixth deposition chamber 38; and the gas gate 58j provides a passageway between the sixth deposition chamber 38 and the post-deposition, substrate-directing chamber 44. Although no gas gates are provided between the post-deposition, substrate-directing chamber 44 and the cool-down chamber 48 and the cool-down chamber 48 and the take-up chamber 52, relatively small slit-like openings 68a and 68b, respectively, provide the passageways for the substrate 11 therebetween.

Figure 3A:
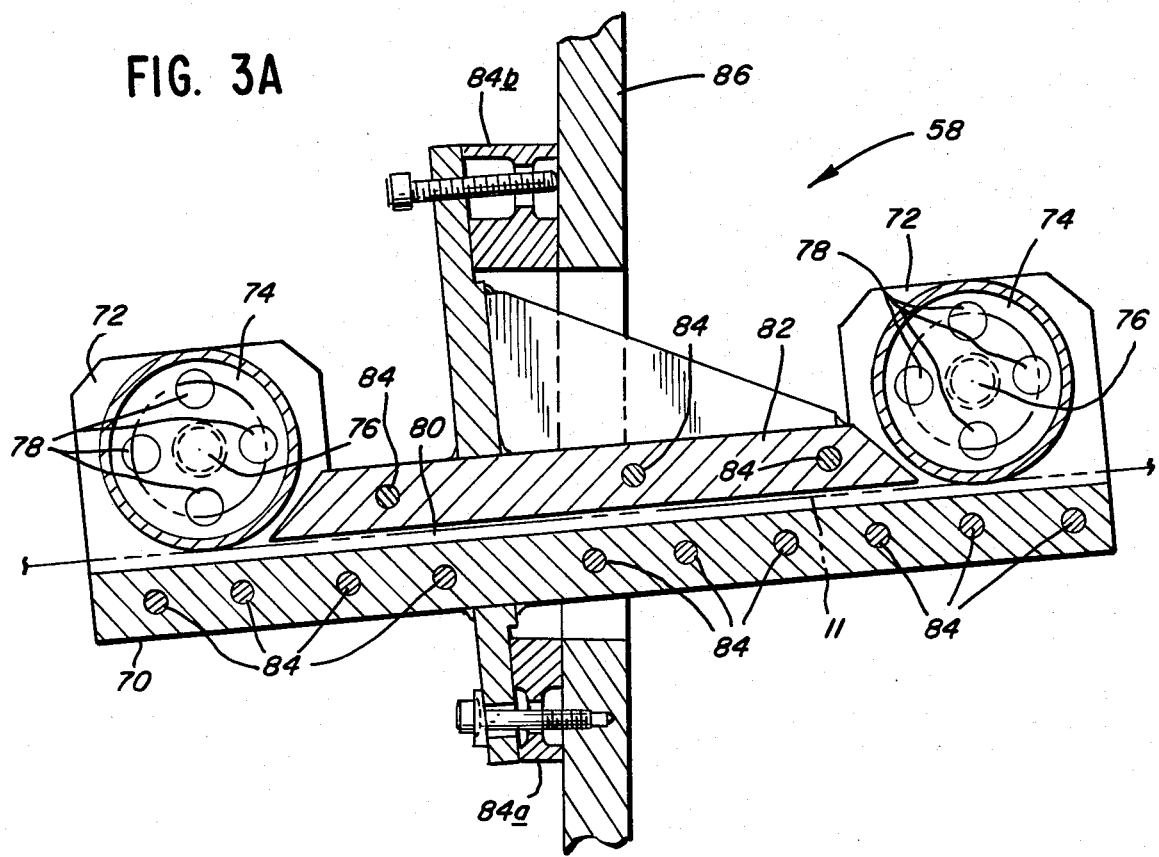
FIG. 3A is an enlarged, cross-sectional view of one possible configuration for the gas gate 58j, shown in FIG. 3, and adapted to illustrate the passageway through which the substrate passes, the rollers for directing the substrate through the gas gate, and the angle that passageway makes relative to the horizontal.
Figure 3B:
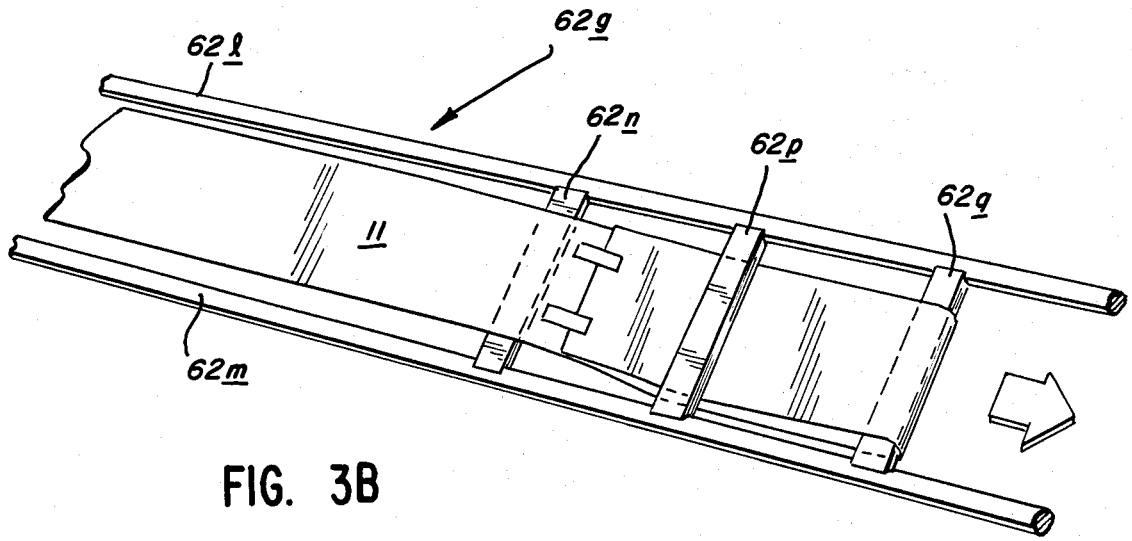
FIG. 3B is an enlarged, fragmentary, perspective view of the elongated flexible belt which forms part of the automatic threader assembly of the present invention.

Although, for purposes of this application, the structural configuration of the gas gates 58a–58j is unimportant as long as the gates operate to permit unidirectional gas flow from adjacent chambers while allowing the substrate 11 to pass therethrough, FIG. 3A depicts a front elevational view of one possible gas gate configuration, shown generally by the reference numberal 58. The gas gate 58 of FIG. 3A generally comprises a lower plate 70 to which oppositely disposed, transversely elongated roller assemblies 72 are secured. Cylindrical rollers 74 are rotatably mounted on an axle 76 opposite ends of which are rotatably secured to the assemblies 72. The length of each cylindrical roller 74 is greater than the width of the web of substrate material 11 passing through the multiple chamber apparatus 26 so that the entire width of the substrate 11 may contact a portion of the circumference of the roller surface. A plurality of roller bearings such as 78 provide for substantially frictionless rotation of the elongated rollers 74 about the axles 76. The cylindrical rollers 74 are adapted to guide the web of substrate material 11 through a relatively narrow slot or passageway 80 formed between the top surface of the bottom gas gate plate 70 and the bottom surface of the top gas gate plate 82. By establishing a unidirectional flow of the reaction gas mixture from one chamber into an adjacent chamber, contamination of the intrinsic deposition chambers (in the preferred embodiment of the present invention contamination of the third and fifth deposition chambers 30 and 36, respectively) by p-type and n-type dopant gas mixtures introduced into the adjacent chambers (in the preferred embodiment of the present invention p-type gas mixtures are introduced into the first and fourth deposition chambers and n-type gas mixtures are introduced into the third and sixth deposition chambers) is substantially prevented. However, some backflow of dopont gas mixtures along the walls of the passageway 80 through the gas gate 58 is always present. To further minimize this backflow, the dopont gas side of the gas gates 58d, 58e, 58h and 58i (between the dopant chambers and the adjacent intrinsic chambers) may also be provided with a port (not shown) through which an inert gas such as argon is introduced. By so introducing an inert gas, it is for the most part, the enert gas rather than the dopont gases in the dopant chambers which backflow into the intrinsic chambers. This process may be called "argon sweeping". Since the prevention of contamination of the intrinsic deposition chamber is essential to the manufacture of a high efficiency product, argon sweeping increases the efficiency of the photovoltaic device.

Since one aspect of the present invention is to stagger the elevation of the chambers of the multiple chamber assembly 26 to permit the substrate 11 to sag under its own weight, the deposition chamber gas gates 58c–58j must be slightly angled to the horizontal. To achieve the desired angularity, a short adjusting wedge 84a is positioned below the lower plate 70 and a longer adjusting wedge 84b is positioned above the upper plate 82. The entire gas gate 58 may then be secured to a vertical plate 86 which may be the wall separating adjacent deposition chambers.

From FIG. 3, it should be apparent that gas gates 58f and 58g need not be angled relative to the horizontal because the third deposition chamber 32, the fourth deposition chamber 34 and the isolation chamber 40 are maintained at the same lowermost elevation. However, gas gates 58h, 58i and 58j are angled slightly relative to the horizontal in the direction of the gas gate 58 shown in FIG. 3A, thereby accomodating the inherent tendency of the substrate 11, extending from the fourth deposition chamber 34 to the post-deposition turning roller 66c, to sag under its own weight. The gas gates 58e, 58d and 58c are angled relative to the horizontal in a direction opposite the direction of the gas gate 58 shown in FIG. 3A, also in an attempt to accomodate the inherent tendency of the substrate 11, extending from the pre-deposition idler roller 66b to the third deposition chamber 32 to sag under its own weight. In actuality the angular disposition of the passageway 80 through the gas gates 58 will be approximately 0 to +8 degrees to horizontal.

As to gas gates 58a and 58b, it should be obvious that the passageway 80 therethrough is oriented in a vertical, rather than a horizontal plane because the web of substrate material 11 is traversing a generally vertical path from the supply chamber 50 through the cleaning chamber 46 and into the pay-off, substrate-directing chamber 42. Further note, that one of the elongated rollers 74 may be eliminated from those gas gates (such as 58a, 58b, 58c and 58j) which are located adjacent substrate idler rollers (such as 66a, 66b and 66c described hereinafter). This is because the substrate idler rollers perform the function of directing the substrate 11 into, through and/or out of a gas gate.

The web of substrate material 11 is wound about a substrate supply or pay-off core 60a which rotates with and is positioned centrally of a substrate supply or pay-off mandril 60b. The supply core 60a and the supply mandril 60b are housed in the substrate chamber 50. The substrate 11 is adapted to move from the supply core 60a on the supply mandril 60b to a substrate supply idler roller 66a, also located in the substrate supply chamber 50. The substrate supply idler roller 66a is adapted to change the path of movement of the substrate 11 by directing the substrate 11 into a generally vertical path of travel through the gas gate 58a and the cleaning chamber 46, the gas gate 58b and the pay-off, substrate-directing chamber 42, to a pre-deposition turning roller 66b. The idler roller 66b again changes the direction of travel of the web of substrate material 11 so that the substrate 11 assumes a generally horizontal path of travel through the gas gate 58c and the first deposition chamber 28, the gas gate 58d and the second deposition chamber 30, the gas gate 58e and the third deposition chamber 32, the gas gate 58f and the intermediate isolation chamber 40, the gas gate 58g and the fourth deposition chamber 34, the gas gate 58h and the fifth deposition chamber 36, the gas gate 58i and the sixth deposition chamber 38, and the gas gate 58j and into the post-deposition, substrate-directing chamber 44. A post-deposition turning roller 66c receives the web of substrate material 11 from the gas gate 58j and changes its direction of travel to a generally vertical path from the post-deposition, substrate-directing chamber 44, through the slotted passageway 68a and the cool-down chamber 48, the slotted passageway 68b and into the substrate take-up chamber 52. Upon contacting the take-up idler roller 66d in the take-up chamber 52, the substrate 11 is guided to the take-up core 60c mounted on and centrally positioned on a take-up mandril 60d also housed within the take-up chamber 52.

A take-up drive motor 60e, connected to conventional take-up reduction gearing 60f, drives the take-up mandril 60d at an adjustable, preselected rate of speed. A take-up idler roller motor 66a connected to take-up idler roller reduction gearing 66f is employed to establish tension or torque between the substrate 11 wound about the take-up core 60c mounted on the take-up mandril 60d and the substrate 11 partially wound about the take-up idler roller 66d. The supply idler roller 66a is driven by a supply idler motor 66g connected to idler roller reduction gearing 66h for establishing tension in the web of substrate material 11 between the supply idler roller 66a and the take-up idler roller 66d. The supply mandril 60b is driven by a supply mandril motor 60g connected to supply mandril reduction gearing 60h so as to develop torque or tension between the substrate 11 wound about the supply core 60a mounted on the supply mandril 60b and the substrate 11 partially wound about the supply idler roller 66a.

The drive speed of the substrate 11, as set by the drive motors, described supra, is approximately one foot of substrate material per minute. Obviously, the rate of travel of the substrate 11 through the multiple chambers of the apparatus 26 is dependent upon the rate that layers of alloy material of necessary thicknesses can be deposited on the substrate surface. It is preferred that alloy layers be deposited at a rate of approximately ten angstroms per second. It is also desirable that the drive and torque motors, described hereinabove, be adjustable so that the tension on the web of substrate material 11 can be varied. The operating tension on the web of substrate material 11, which is defined as that tension on the substrate 11 as it passes through chambers between the supply idler roller 66a and the take-up idler roller

66d, should, desirably, be maintained below ten pounds per linear inch. The wrap-up tension, which is defined as that tension on the substrate 11 as it passes between the take-up idler roller 66d and the take-up core 60c, should, desirably, be maintained as low as possible; and the pay-out tension, which is defined as that tension on the substrate 11 as it passes between the supply idler roller 66a and the supply core 60a, should also, desirably, be maintained as low as possible.

It is further contemplated, although not illustrated, that each of the drive and torque motors, described above, be provided with tachometers. In this manner, the actual speed of rotation of the take-up core 60c and the supply core 60a can be monitored and adjusted with the constantly changing diameter of the web of substrate material 11 wound thereabout. Also, from monitoring the speed of the take-up torque motor tachometer, it would be possible to calculate the diameter of the roll of substrate 11 on the take-up core 60c or the supply core 60a at a given point in time, thereby providing an accurate determination of when the end of a particular web of substrate material 11 is at hand.

The interleaf assembly 64, housed adjacent the supply mandril 60b in the supply chamber 50, includes an interleaf removal roller 64a driven by an interleaf drive motor 64b, connected to the removal roller 64a by removal roller reduction gearing 64c. Because it is essential to maintain the quality of the web of substrate material 11, protective interleaf sheeting such as 64d may be introduced between adjacent layers of the substrate material 11 wound about the supply core 60a. Obviously, the interleaf sheeting 64d must be removed from between adjacent layers of the substrate 11 prior to the initiation of the deposition processes in the chambers of the multiple chamber apparatus 26. To that end, the leading edge of the interleaf sheeting 64d from the supply core 60a is attached to the interleaf removal roller 64a and is wound thereabout as the substrate 11 is unwound from the supply core 60a to move through the assembly 26. In order to prevent disfiguration of the alloy layers deposited upon the substrate 11 after the substrate 11 has passed through the deposition chambers, the interleaf sheeting 64a is desirably reintroduced between adjacent layers of the substrate 11 as the substrate 11 is wound about the take-up core 60c in the substrate take-up chamber 52. To accomplish this, a core 64e having protective interleaf sheeting 64d wound thereon is housed adjacent the take-up mandril 60d in the take-up chamber 52. The leading edge from the interleaf sheeting 64d wound about interleaf core 64e is attached to one side of the substrate 11 prior to winding the substrate about the take-up core 60c. Torque between the take-up core 60c and the interleaf introduction core 64e is provided by an interleaf motor 64f connected to the interleaf core 64e by conventional interleaf reduction gearing 64g.

The automatic threader assembly 62 includes a threader supply motor 62a operatively connected by conventional threader reduction gearing 62b to an automatic threader supply roller 62c. The automatic threader supply roller 62c is housed adjacent the supply mandril 60b in the supply chamber 50. On the take-up side, a threader take-up motor 62d is operatively connected to take-up threader reduction gearing 62e for driving an automatic threader take-up roller 62f housed adjacent the substrate take-up mandril 60d in the take-up chamber 52.

An elongated flexible belt 62g, a section of which is shown in FIG. 2B, is wound about and extends from the threader supply roller 62c, the supply idler roller 66a, through the gas gate 58a and the cleaning chamber 46, the gas gate 58b and the pay-off, substrate-directing chamber 42, about the pre-deposition idler roller 66b, through the gas gate 58c and the first deposition chamber 28, through the gas gate 58d and the second deposition chamber 30, through the gas gate 58e and the third deposition chamber 32, through the gas gate 58f and the intermediate isolation chamber 40, through the gas gate 58g and the fourth deposition chamber 34, through the gas gate 58h and the fifth deposition chamber 36, through the gas gate 58i and the sixth deposition chamber 38, through the gas gate 58j and the post-deposition, substrate-directing chamber 44, about the post-deposition idler roller 66c, through the slot 68a and the cooldown chamber 48, through the slot 68b and the take-up chamber 52, about the take-up idler roller 66d, about the take-up side idlers 66j and 66k, to the automatic threader take-up roller 62f. The belt 62g includes a pair of relatively thin, elongated, specedly connected strands 62l and 62m. The strands 62l and 62m of the belt 62g are preferably connected by only three transverse attachment links 62n, 62p and 62q. The length of the attachment links 62n, 62p and 62q must be greater than the width of the web of substrate material 11 so that the strands 62l and 62m will not cover or mask any portion of the substrate 11 in the deposition chambers of the apparatus 26.

In the operation of the automatic threader assembly 62, the leading edge of the web of substrate material 11 on the core 60a is threaded over attachment line 62m, under attachment link 62p, around attachment link 62q, back under attachment link 62p and taped or otherwise secured to itself adjacent attachment link 62n. The threader supply motor 62a and the threader take-up motor 62d are then activated and the attachment links 62n, 62p and 62q on the flexible belt 62g are moved from a position adjacent the automatic threader supply roller 62c, proximate the supply mandril 60b, through the multiple chambers of the assembly 26 to a position adjacent the automatic threader take-up roller 62f, proximate the take-up mandril 60d. Upon reaching the take-up roller 62f, the leading edge of the web of substrate material 11 is removed from the automatic threader assembly 62 and secured to the substrate take-up core 60c on the take-up mandril 60d. In this manner, the web of substrate material 11 is automatically threaded from a position adjacent the supply mandril 60b in the supply chamber 50, through the multiple chambers of the assembly 26, to a position adjacent the take-up mandril 60d in the take-up chamber 52. The flexible belt 62g may now either be wound about the threader take-up roller 62f or returned to and wound about the threader supply roller 62c. While it is not important about which roller the belt 62g is wound, it is important the attachment links 62n, 62p and 62q be wound about one of the rollers 62f or 62c so that said links do not mask any portion of the substrate 11.

It is desirable that the post-deposition idler roller 66c be "steerable". In this manner, a servo control, operatively connected to the steering mechanism of the idler roller 66c is adapted to move the idler roller 66c a few thousandths of an inch, thereby preventing adjacent layers of the web of substrate material 11 from telescoping as the substrate 11 is wound about the take-up core 60c on the take-up mandril 60d.

Both, the circumference of the substrate supply mandril 60b and the circumference of the substrate take-up mandril 60d may be made expandable. In this manner, the core 60a about which the pre-deposition web of substrate material 11 is wound, can be securely fastened to the supply mandril 60b by expanding the circumference of the supply mandril 60b. Similarly, removal of the take-up core 60c about which the post-deposition web of substrate material 11 is wound can be accomplished by simply reducing the circumference of the take-up mandril 60d.

Once the web of substrate material 11 is automatically threaded through the chambers of the assembly 26 and secured to the take-up core 60c on the take-up mandril 60d; and the leading edge of the interleaf sheeting 64d from between adjacent layers of the substrate 11 wound about the supply core 60a on the supply mandril 60b secured to interleaf removal roller 64a, and the leading edge of the fresh interleaf sheeting 64d reattached from interleaf supply core 64e to the substrate 11 at the take-up core 60c on the take-up mandril 60d; doors or other openings, not illustrated, into the supply chamber 50 and the take-up chamber 52 are sealed. The multiple chambers of the assembly 26 are now operatively connected in an air-tight enclosure wherein air from the environment can not leak into the assembly 26 and reaction gas mixtures selectively introduced into the various chambers of the assembly 26 can not escape to the environment.

C. Heating the Substrate Material

FIG. 4 is a diagrammatic representation of the multiple chambers which combine to form the apparatus 26 of the present invention showing, as described hereinabove, the gas gates 58a–58i, the substrate stretching from the supply core 60a on the supply mandril 60b to the take-up core 60c on the take-up mandril 60d and the idler rollers 66a, 66b, 66c, 66d adapted to change the direction of travel of the substrate 11. Further, FIG. 4 adds, diagrammatically, the holders for heating elements 86 and the heater controls 88 and 90 necessary to heat the chambers of the assembly 26 for warming the substrate 11 passing therethrough.

It is imperative that the gas gates 58a–58i also be heated. Were the substrate 11 allowed to cool as it passed between the various chambers of the assembly 26, the substrate 11 would wrinkle, or canoe, or waffle, thereby making it virtually impossible to deposit layers of uniform thickness thereonto. Further, if the substrate 11 were allowed to cool between the chambers, it would be more likely to collect contaminants from the interior walls of those chambers. Although the gas gates 58a–58i will be described as equipped with rod-type resistance heaters and the deposition chambers will be described as equipped with infrared lamps arranged to achieve an optimum heating profile, any type of known heating elements capable of providing uniform heating of the substrate 11 and the chambers may be used without departing from the spirit and scope of the present invention.

Although not illustrated for the gas gates 58a–58i of FIG. 4, it is to be understood that the bottom plate 70 and top plate 82 of the gas gate 58, shown in FIG. 3A, include a plurality of these rod-type resistance heaters, such as 84. Further, a holder for a plurality of heating elements 86a is provided in the cleaning chamber 46; a pair of holders for a plurality of heating elements 86b provided about the pre-deposition idler roller 66b in the pay-off, substrate-directing chamber 42; a holder for a plurality of heating elements 86c is provided in the first deposition chamber 28; a holder for a plurality of heating elements 86d is provided in the second deposition chamber 30; a holder for a plurality of heating elements 86e is provided in the third deposition chamber 32; a holder for a plurality of heating elements 86f is provided in the fourth deposition chamber 34; a holder for a plurality of heating elements 86g is provided in the fifth deposition chamber 36; and a holder for a plurality of heating elements 86h is provided in the sixth deposition chamber 38. Additionally, a holder for a plurality of heating elements 86i may be provided about post-deposition idler roller 66c in the post-deposition, substrate-directing chamber 44, and a holder for a plurality of heating elements 86j may be provided in the cool-down chamber 48. The number and spacing of the heating elements in the holders 86 in the chambers of the apparatus 26 is dependent upon the following system perameters: (1) maintaining a uniform temperature of 200–300 degrees centigrade from the cleaning chamber 46 through the pay-off, substrate-directing chamber 42, the deposition chambers 28, 30, 32, the intermediate isolation chamber 40, and the deposition chambers 34, 36 and 38; (2) a cool-down temperature of approximately 100 degrees at the take-up mandril 60d in the take-up chamber 52; and (3) an uncontrolled temperature in the supply chamber 50.

Although, only shown connected to the holder for heating elements 86a in the cleaning chamber 46, it is to be understood that each of the other holders for heating elements 86b–86j, in the other chambers of the apparatus 26, are connected to individual thermocoupler controllers such as 90 and power switches such as 88. Each power switch 88 is in turn connected to the main power supply. The thermocouple controllers 90 are adapted to measure the temperature of the substrate 11 and compare that measurement with a preselected temperature. The thermocoupler controllers 90 are adapted to activate the power switches 88 to which they are connected for energizing the heating elements 86a–86j in the event the substrate 11 in any chamber falls below the preselected temperature. The thermocoupler controllers 90 are also adapted to deactivate the power switches to which they are connected for deenergizing the heating elements 86a–86j when the substrate 11 has been warmed to or above the preselected temperature.

D. Producing Plasma in the Deposition Chambers

Figure 5:
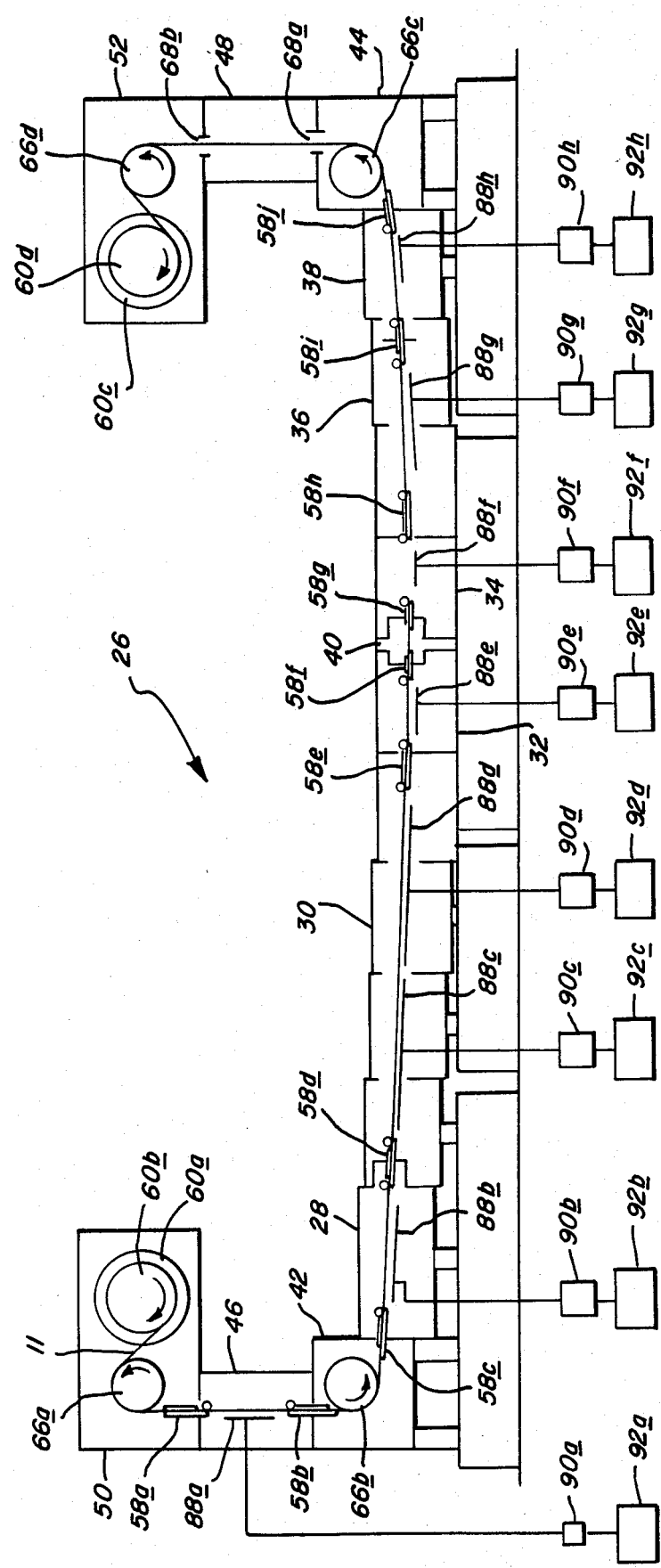
FIG. 5 is a diagrammatic representation of the multiple chamber deposition apparatus of the present invention showing the gas gates, the substrate stretching from the supply cahmber to the take-up cahmber, and the cathodes and associated power generation equipment within the deposition chambers for depositing successive plasma layers onto the surface of the substrate.

FIG. 5 is a diagrammatic representation of the multiple chambers which combine to form the apparatus 26 of the present invention showing, as described hereinabove: the gas gates 58a–58i; the substrate stretching from the supply core 60a on the supply mandril 60b to the take-up core 60c on the take-up mandril 60d and the idler rollers, 66a, 66b, 66c, 66d adapted to change the direction of travel of the substrate 11. Further, FIG. 5 adds diagrammatically, the cathodes, generally 88, and the power generation equipment within the deposition chambers of the apparatus 26 for depositing successive plasma layers onto the surface of the substrate 11.

Although not illustrated in FIG. 5, the holders for the heating elements 86, described hereinabove with reference to FIG. 4, are positioned adjacent to and on one side of the web of substrate material 11 passing through the chambers of the apparatus 26. More particularly, the holder for heating elements 86a is positioned adjacent to and on one side of the substrate 11 passing through the cleaning chamber 46, the holders for the heating elements 86c is positioned adjacent to and on one side of the substrate 11 passing through the first deposition chamber 28, the holder for the heating elements 86d is positioned on one side of and adjacent to the substrate 11 passing through the second deposition chamber 30, the holder for the heating elements 86e is positioned adjacent to and on one side of the substrate 11 passing through the third deposition chamber 32, the holder for the heating elements 86f is positioned adjacent to and on one side of the substrate 11 passing through the fourth deposition chamber 34, the holder for the heating elements 86g is positioned adjacent to and on one side of the substrate 11 passing through the fifth deposition chamber 36, and the holder for the heating element 86h is positioned adjacent to and on one side of the substrate 11 passing through the sixth deposition chamber 38.

The cathodes, shown in FIG. 5 as 88a–88h, are located in the chambers of the apparatus on the side of the web of substrate material 11 opposite the holder for the heating elements 86. More particularly, cathode 88a is positioned adjacent to and on the side of the substrate 11 opposite from the holder for the heating elements 86a in the cleaning chamber 46, the cathode 88b is positioned adjacent to and on the side of the substrate 11 opposite from the holder for the heating elements 86c in the first deposition chamber 28, the cathodes 88c and 88d are positioned adjacent to and on the side of the substrate 11 opposite from the holder for heating elements 86d in the second deposition chamber 30, the cathode 88e is positioned adjacent to and on the side of the substrate 11 opposite from the holder for the heating elements 86e in the third deposition chamber 32, the cathode 88f is positioned adjacent to and on the side of the substrate 11 opposite from the holder for the heating elements 86f in the fourth deposition chamber 34, the cathode 88g is positioned adjacent to and on the side of the substrate 11 opposite from the holder for the heating elements 86g in the fifth deposition chamber 36, and the cathode 88h is positioned adjacent to and on the side of the substrate 11 opposite from the holder for the heating elements 86h in the sixth deposition chamber 38. Although the gap or spacing between the substrate 11 and the cathodes 88 is not critical, for optimum deposition it is desirable that the cathodes 88a–88h be located within a range of 1 to 2 inches from the substrate 11.

The length of the cathodes 88 is one of the factors which determines the thickness of the alloy layers deposited on the substrate 11, as the substrate 11 passes through the deposition chambers. By maintaining the other operating parameters of the apparatus 26, which have been discussed hereinabove, constant; such as the speed of travel of the web of substrate material 11 from the supply chamber 50 to the take-up chamber 52, as well as the flow rates of the reaction gas mixtures entering the chambers and the vacuum pressures within the chambers, both of which will be discussed hereinafter, the following lengths of the cathodes produce the following thicknesses of alloy layers: a cathode of approximately 30 inches in the first deposition chamber 28 will produce a p-type alloy layer 100–200 angstroms thick; a total cathode length of approximately 100 inches in the second deposition chamber 30 will produce an intrinsic alloy layer 2,000–3,000 angstroms thick; a cathode length of approximately 12 inches in the third deposition chamber 32 will produce an n-type alloy layer 50–100 angstroms thick; a cathode length of approximately 12 inches in the fourth deposition chamber 34 will produce a p-type alloy layer 50–150 angstroms thick; a cathode length of approximately 30 inches in the fifth deposition chamber 36 will produce an intrinsic alloy layer 1000 angstroms thick; and a cathode length of approximately 12 inches in the sixth deposition chamber 38 will produce an n-type alloy layer approximately 50–100 angstroms thick. Further, the preferred length of the cathode 88a in the cleaning chamber 46 is approximately 15 inches.

Energization of the reaction gas mixtures introduced into the deposition chambers is necessary for the production of plasma adapted to be deposited on the substrate 11. Accordingly, a tuner 90a is provided to regulate a radio frequency power supply 92a for energizing cathode 88a in the cleaning chamber 46; a tuner 90b is provided to regulate a radio frequency power supply 90b for energizing cathode 88b in the first deposition chamber 28; a tuner 90c is provided to regulate a radio frequency power supply 92c for energizing the first cathode 88c in the second deposition chamber 30 and a tuner 90d is provided to regulate a radio frequency power supply 92d for energizing the second cathode 88d in the second deposition chamber 32; a tuner 90e is provided to regulate a radio frequency power supply 92e for energizing cathode 88e in the third deposition chamber 34; a tuner 90f is provided to regulate a radio frequency power supply 92f for energizing a cathode 88f in the fourth deposition 36; a tuner 90g is provided to regulate a radio frequency power supply 92g for energizing a cathode 88g in the fifth deposition chamber 36; and a tuner 90h is provided to regulate a radio frequency power supply 92h for energizing a cathode 88h in the sixth deposition chamber. In the preferred embodiment, the radio frequency power supplies 92b–92h and the tuners 90b–90h are set to provide approximately thirteen mega-Herz of power to the cathodes 88b–88h in the deposition chambers and the tuner 90a and the power supply 92a are set to provide ten kilo-Herz of power to the cathode 88a in the cleaning chamber 46.

E. Introducing the Reaction Gas Mixtures

FIG. 6 is a diagrammatic representation of the multiple chambers which combine to form the apparatus 26 of the present invention. Added to the multiple chambered apparatus, described hereinabove, are the feed conduits and the valving assemblies which are employed to introduce the preselected mixtures and proportions of reaction gases into the reaction chambers of the apparatus 26.

For the gas flow illustration of FIG. 6, the abbreviation "$P_1$" indicates the first p-type alloy layer adapted to be deposited onto the substrate 11 in the first deposition chamber 28, the abbreviation "$I_1$" indicates the intrinsic alloy layer adapted to be deposited atop the $P_1$ layer in the second deposition chamber 30, the abbreviation "$N_1$" indicates the first n-type alloy layer adapted to be deposited atop the intrinsic layer in the third deposition chamber 32, the abbreviation "$P_2$" indicates the second p-type alloy layer adapted to be deposited atop the $N_1$ layer in the fourth deposition chamber 34, the abbreviation "$I_2$" indicates the second intrinsic alloy layer adapted to be deposited atop the $P_2$ layer in the fifth deposition chamber 36, and the abbreviation "$N_2$" indicates the second n-type layer adapted to be deposited atop the intrinsic layer in the sixth deposition chamber 38. By employing the foregoing number and arrangement of chambers, the apparatus 26 is adapted to deposit six successive amorphous alloy layers onto the substrate 11 and previously deposited alloy layers, wherein the intrinsic alloy layers deposited in deposition chambers 30 and 36 differ in composition from the alloy layers deposited in the other deposition chambers by the absence of at least the p-type and n-type dopant elements. As previously stated, it is essential that the intrinsic alloy layers deposited onto the substrate 11 be of high purity in order to produce high efficiency cells. To that end, the p-type and n-type dopant gas mixtures introduced in the first, third, fourth and sixth depostion chambers cannot be permitted to enter the intrinsic deposition chambers 30 and 36. The isolation of the dopant reaction gases must be sufficient to provide a ratio of at least $10^{-3}$ in dopant concentration between the intrinsic deposition chambers 30 and 36 and the dopant deposition chambers 28, 32, 34 and 38. It is also imperative that the p-type and n-type dopant gases in the third and fourth deposition chambers 32 and 34 be isolated from one another.

In practice, and in accordance with the preferred embodiment of the present invention, at least one reaction gas is provided which includes the intrinsic material which is common to all of the deposited alloy layers. While it is preferred that the intrinsic layer be formed of amorphous silcon, an intrinsic layer formed of amorphous germanium is well within the scope of the present invention. Although not limited thereto, the reaction gases combining to form the intrinsic material can include silicon tetrafluoride gas ($SiF_4$), plus hydrogen gas, silicon tetrafluoride gas plus silane gas ($SiH_4$), silicone tetrafluoride gas alone, or silane gas alone. Alternatively, amorphous germanium alloy layers may be deposited on the substrate 11. For example, the intrinsic gases could include germanium tetrafluoride gas ($GeF_4$) plus hydrogen gas, germanium tetrafluoride gas plus silane gas, germanium tetrafluoride gas alone, or germane gas ($GeH_4$) alone. The intrinsic mixture could also include any combination or all of the aforementioned gases without departing from the spirit of this invention. An inert gas such as argon may also be mixed with the other intrinsic gases for introduction into the intrinsic deposition chambers 30 and 36. The p-type layers are formed by introducing argon, diborine ($B_2H_6$) and methane ($CH_4$) into the p-type deposition chambers 28 and 34. The n-type alloy layers are formed by introducing argon, methane and posphine ($PH_3$) into the n-type deposition chambers 32 and 38. The same reaction gases as are introduced into the intrinsic deposition chambers 30 and 36 are also introduced into the isolation chamber 40; argon and hydrogen gases are introduced into the cleaning chamber 46 through the pay-off, substrate-directing chamber 42; and nitrogen gas is introduced into all of the chambers for the purpose of purging the chambers of the apparatus 26 after the amorphous layers have been deposited on the entire web of substrate material 11. Further, argon gas will be introduced at the leading end of the dopant chamber gas gates 58d, 58e, 58h and 58to accomplish the argon sweeping process.

Figure 8:
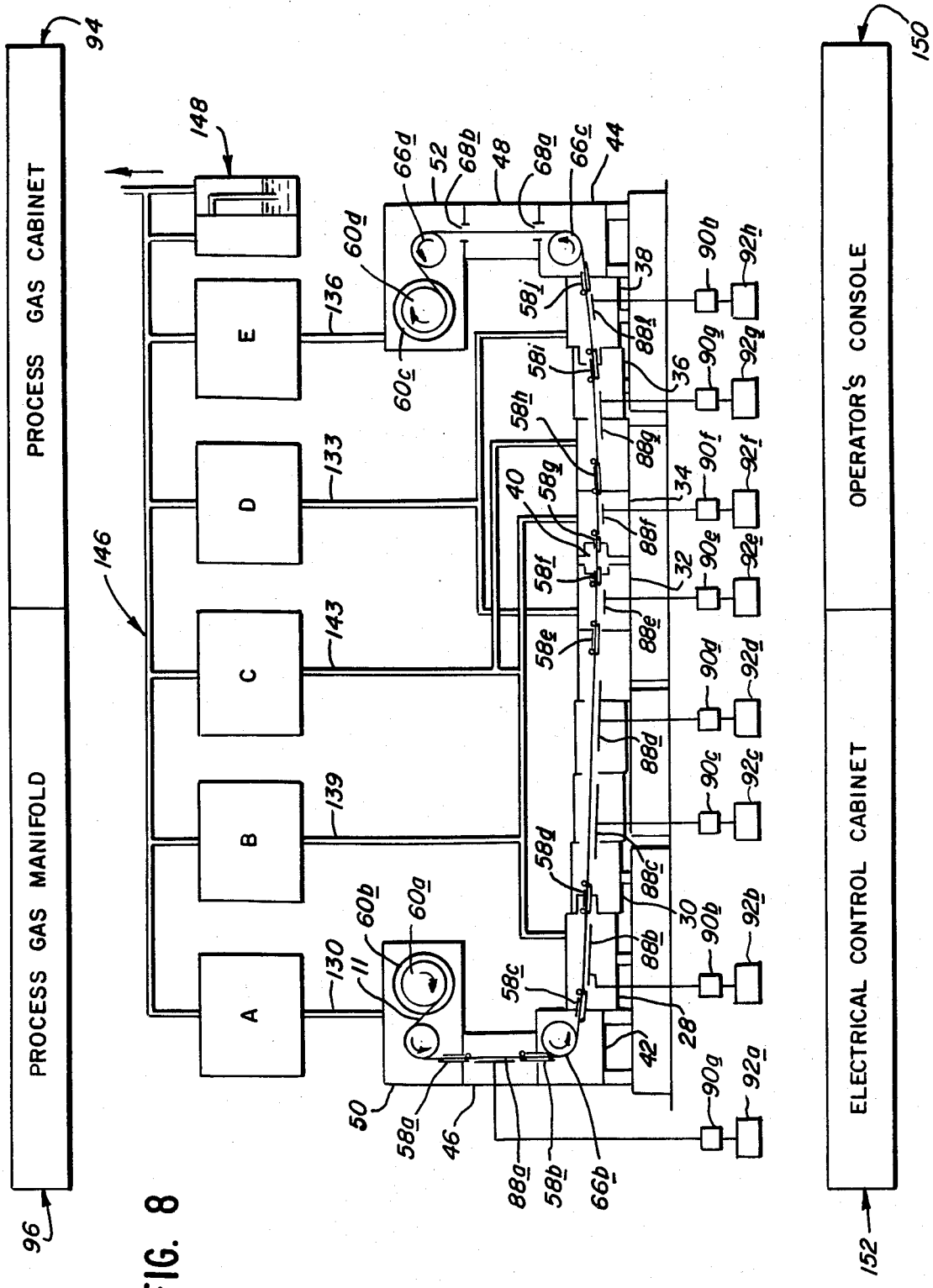
FIG. 8 is a diagrammatic representation of the multiple chambers deposition apparatus of the present invention showing the gas gates, the substrate stretching from the supply cahmber to the take-up chamber, the cathodes and power generation equipment, the pumping systems for exhausting noxious reaction gas mixtures from the chambers, the process gas cabinet for storing the reaction gas cylinders, the process gas manifold for mixing and introducing reaction gases into the chambers, and the cabinetry in which the electrical controls are housed.

In the preferred embodiment and as shown in FIGS. 6 and 8, a process gas cabinet 94 is placed behind the apparatus 26 and to the left of the process gas cabinet 94 is a process gas manifold 96. The process gas cabinet 94 houses pressurized tanks or cylinders filled with the reaction gases adapted to be introduced into the chambers of the apparatus 26. More paticularly, hydrogen gas is provided in cylinder 94a, methane gas is provided in cylinder 94b, germanium tetrafluoride gas is provided in cylinder 94c, germane gas is provided in cylinder 94d, silane gas is provided in cylinderr 94e, silicone tetrafluoride gas is provided in cylinder 94f, phosphine gas is provided in cylinder in 94g and diborine gas is provided in cylinder 94h. Additionally, at least one cylinder of argon gas 94i is provided outside of the process gas cabinet 94. The process gas manifold 96 includes a plurality of compartments into which preselected proportions of the reaction gases stored in the cylinders 94a–94i are introduced to be subsequently fed into corresponding chambers of apparatus 26. Accordingly, the preselected reaction gases, described hereinabove, are introduced into a cleaning compartment 96a in the process gas manifold 96 which corresponds to the cleaning chamber 1046 of the apparatus 26; the preselected reaction gases are introduced into a $P_1$ compartment 96b in the process gas manifold 96 which corresponds to the first deposition chamber 28; the preselected reaction gases are introduced into an $I_1$ compartment 96c in the process gas manifold 96 which corresponds to the second deposition chamber 30; the preselected reaction gases are introduced into an $N_1$ compartment 96d in the process gas manifold 96 which corresponds to the third deposition chamber 32; the preselected reaction gases are introduced into an isolation compartment 96e in the process gas manifold 96 which corresponds to the isolation chamber 40; the preselected reaction gases are introduced into a $P_2$ compartment 96f in the process gas manifold 96 which corresponds to the fourth deposition chamber 34; the preselected reaction gases are introduced into an $I_2$ compartment 96g in the process gas manifold 96 which corresponds to the fifth deposition chamber 36; and the preselected reaction gases are introduced into the $N_2$ compartment 96h in the process gas manifold 96 which corresponds to the sixth deposition chamber 38.

As becomes readily apparent from viewing the mixing lines leading from the gas cylinders 94a–94h into the mixing compartment 96a–96h, argon is fed from the argon cylinder 94i through conduit 98a: to the cleaning compartment 96a via line 98b; to the $P_1$ compartment 96b via line 98c; to the $I_1$ compartment 96c via line 98d; to the $N_1$ compartment 96d via line 98e; to the isolation compartment 96e via the line 98f; to the $P_2$ compartment 96f via line 98g; to the $I_2$ compartments 96g via the line 98; and to the $N_2$ compartment 96h via the line 98i. The diborine gas is fed from the cylinder 94h through conduit 100a: to line 100b wherein it is introduced into the $P_1$ compartment 96b; and to line 100c from which it is introduced to the $P_2$ compartment 96f. The phosphine gas is fed from the cylinder 94g through condiuit 102a: to line 102b from which it is introduced into the $N_1$ compartment 96d; and to line 102c from which it is introduced into the $N_2$ compartment 96h. The silicon tetrafluoride gas is fed from the cylinder 94f through conduit 104a: to line 104b from which it is introduced into the $I_1$ compartment 96c; to line 104c from which it is introduced into the isolation compartment 96e; and to line 104d from which it is introduced to the $I_2$ compartment 96g. The silane gas is fed from the cylinder 94e through conduit 106a: to line 106b from which it is introduced into the $I_1$ compartment 96c; to line 106c from which it is introduced into the isolation compartment 96e; and to line 106d from which it is introduced into $I_2$ compartment 96g. The germane gas is fed from the cylinder 94d through conduit 108a to line 108b from which it is introduced into the $I_1$ chamber 96c. The germanium tetrafluoride gas is fed from the cylinder 94c through conduit 110a to line 110b from which it is introduced into the $I_1$ compartment 96c. The methane gas is fed from the cylinder 94b through conduit 112a from which it is introduced into: the $P_1$ compartment 96b via line 112b; the N₁ compartment 96d via line 112c; the P₂ compartment 96f via the line 112d and the N₂ compartment 96h via the line 112e. Finally the hydrogen gas is fed from the cylinder 94a through conduit 114a; to the line 114b from which it is introduced into the cleaning compartment 96a; to the line 114c from which it is introduced into the I₁ compartment 96c; to the line 114d from which it is introduced into the isolation compartment 96e; to the line 114e from which it is introduced into the I₂ compartment 96g; and to the line 114b from which it is introduced into the post-deposition, substrate-directing chamber 44. While conduits for germane and germanium tetrafluoride have been described as leading only into the I₁ compartment 96c, it would be necessary to also provide conduits for channeling those gases into the isolaton compartment 96e and the I₂ compartment 96g if an amorphous germanium alloy material rather than a silicon alloy material was employed. Since the preferred embodiment of the present invention is an amorphous silicone alloy material, the silane and silicone tetrafluoride gas lines have been shown feeding these gases into the isolation compartment 96e and the I₂ compartment 96g as well as the I₁ compartment 96c.

FIG. 6A is a schematic illustration of the general valving system common to all of the compartments in the process gas manifold 96. In the specific embodiment shown in FIG. 6A, three reaction gases from the reaction gas cylinderrs 94a–94i in the process gas cabinet 94 are fed into one of the compartments of the process gas manifold for mixing therein. The same type of valving arrangement is employed for the other compartments 96a–96h of the process gas manifold by adding or substracting feed lines and the corresponding valving from those shown in FIG. 6A. More particularly, the valving system for the isolation compartment 96e would include four feed lines for introducing four reaction gases thereinto and four corresponding valving arrangements; rather than the three feed lines and three valving arrangements for introducing three reaction gases into compartment 96b illustrated in FIG. 6A.

For purposes of illustrating the operation of the valving arrangements, the introduction of three reaction gases into the P₁ compartment 96b will be described in detail. In the P₁ compartment 96b, argon gas is introduced via line 98c, methane gas is introduced via line 112b and diborine gas is introduced via line 100b. The box 122 represents a blower for introducing oiled and filtered shop air into the chambers of the apparatus 26. The blower 122 is constantly operating to provide an input into a solenoid control valve 122a which is connected to an on-off valve 120c, a solenoid valve 124b which is connected to an on-off valve 120b and a solenoid 124c which is connected to an on-off valve 120a. The solenoid valves 124 are normally operative to prevent the flow of reaction gases into the chambers of the apparatus 26. However, upon receiving an electrical signal, the solenoid valves 124 are adapted to open the on-off vlaves 120 for intiating the mixture of reaction gases fed by lines 98c, 112b and 100b through chamber-introducing feed line 126a to the P₁ deposition chamber 28 of the apparatus 26. An additional on-off valve 128 is provided adjacent the first deposition chamber 28 to open and close the flow of reaction gas to and from the chamber during vacuumizing and devacummizing operations. The actual mixing of the reaction gases from the cylinders 94a–94i of the process gas cabinet is accomplished by setting the metering valves 116 and the on-off valves 118. Therefore, the flow of argon gas introduced into the compartment 96b of FIG. 6A is controlled by metering valve 116a and on-off valve 118a; the flow of methane gas is controlled by metering valve 116b and on-off valve 118b and the diborine gas is proportioned by metering valve 116c and on-off valve 118c. The metered argon, methane and diborine gases are then mixed together, when the apparatus is operational, in feed line 126a for introduction into the first deposition chamber 28.

In a like manner, reaction gases from the cylinders 94a–94i of the process gas cabinet are proportioned by the metering valves and shut-off valves in the 96a–96h compartments of the process gas manifold and then introduced through feed lines 126a–126g to the chambers of the apparatus 26. More specifically, metered and mixed reaction gases are fed from the I₁ compartment 96c in the process gas manifold through feed line 126b to the second deposition chamber 30; metered and mixed reaction gases are fed from the N₁ compartment 96d in the process gas manifold through feed line 126c to the third deposition chamber 32; metered and mixed reaction gases are fed from the isolation compartment 96e in the process gas manifold through feed line 126d to the fourth deposition chamber 34; metered and mixed reaction gases are fed from the P₂ compartment 96f in the process gas manifold through the feed line 126e to the fourth deposition chamber 34; metered and mixed reaction gases are fed from the I₂ compartment 96g in the process gas manifold through the feed line 126f to the fifth depositon chamber 36; and metered and mixed reaction gases are fed from the N₂ compartment 96h in the process gas manifold compartment through the feed line 126g to the sixth deposition chamber 38. Additionally, metered and mixed reaction gases from the cleaning compartment 96a in the process gas manifold are fed through line 126h into the substrate cleaning chamber 46. Finally, a further tank or cylinder of argon gas 94j is operatively connected via line 128 for introduction into the pay-off, substrate-directing chamber 42, the first deposition chamber 28, the second deposition chamber 30, the third deposition chamber 32, the isolation chamber 50, the fourth deposition chamber 34, the fifth deposition chamber 36, the sixth deposition chamber 38 and the post-deposition, substrate-directing chamber 44.

The reaction gases are delivered from the process gas manifold to the chambers of the apparatus 26 at a flow rate which provides: (1) the desired flow of the gases through the passageways 80 in the gas gates 58 to sustain the plasmas in the chambers of the apparatus 26; (2) the required isolation from diffusion of the dopant reaction gases introduced into the first deposition chamber 28 and the third deposition chamber 32 into the intrinsic deposition chamber 30; (3) the required isolation from diffusion of the dopant reaction gases introduced into the fourth deposition chamber 34 and the sixth deposition chamber 38 from the intrinsic deposition chamber 36; and (4) the required isolation from diffusion of the dopant reaction gases introduced into the third deposition chamber 32 from the dopant reaction gases introduced into the fourth deposition chamber 34 and of the dopant reaction gases introduced into fourth deposition chamber 34 from the dopant reaction gases introduced into the third deposition chamber 32. Also the rate of introduction of reaction gas must not only be sufficient to sustain the plasmas in the chambers, but must also provide a concentration ratio of the dopant reaction gases to the intrinsic reaction gases of about $10^{-3}$. By maintaining that ratio, the purity of the intrinsic amorphous alloy in the intrinsic deposition chamber will be maintained in a satisfactory range.

In order to insure the desired flow of reaction gases from chamber to chamber and thereby insure the proper isolation of reaction gases between chambers it is desirable to maintain the pressure in the first deposition chamber 28, the third deposition chamber 32, the fourth deposition chamber 34, and the sixth deposition chamber 38 at about 0.55 torr and the pressure in the pay-off, substrate-directing chamber 46, the post-deposition, substrate-directing chamber, the second deposition chamber 30, and the fifth deposition chamber 36 at about 0.6 torr. It should be apparent that the flow rate of the reaction gases entering the chambers of the apparatus 26 are adapted to operate in conjunction with the flow rate of reaction gases removed from the chambers to produce the desired vacuumized pressure and the pressure differentials, described hereinabove. The pumping systems for removing reaction gases from the chambers and isolating reaction gases in adjacent chambers will be discussed in detail in the section which follows. For purposes of illustration, it has been found that a flow rate within a range of 200-600 SCCM, accomplishes the purposes outlined above.

F. Achieving Isolation at Selected Vacuum Pressures

Figure 7:
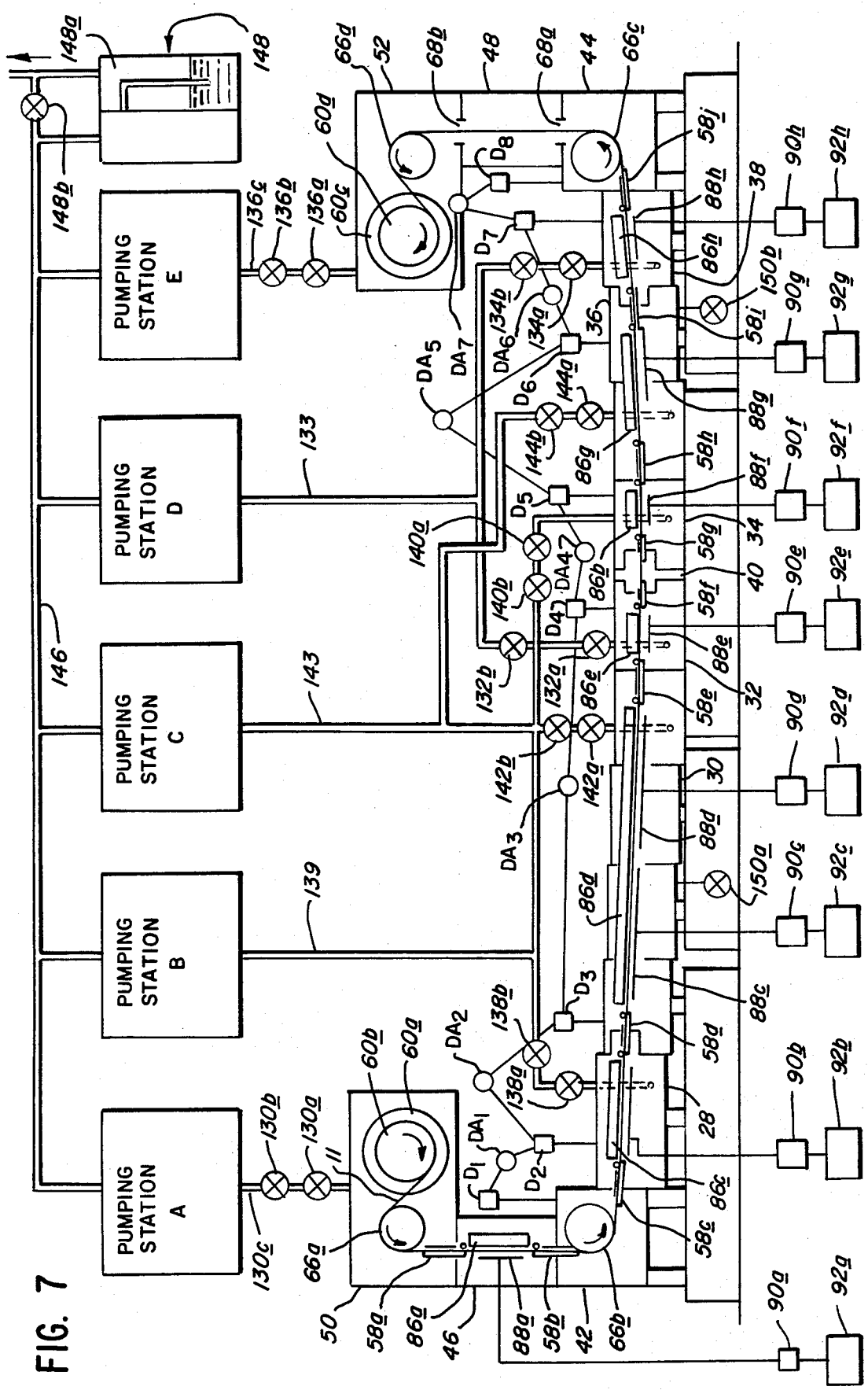
FIG. 7 is a diagrammatic representation of the multiple chambers which combine to form the apparatus of the present invention showing the gas gates, the substrate stretching from the supply cahmber to the take-up chamber, the heating elements, the cathodes and power generation equipment therefor, and the pumping stations for exhausting noxious reaction gas mixtures from the chambers.

FIG. 7 is a diagrammatic representation of the multiple chambers which combine to form the apparatus 26 of the present invention showing, as described hereinabove: the gas gates 58a-58i; the substrate stretching from the supply core 60a on the supply mandril 60b to the take-up core 60c on the take-up mandril 60d; the idler rollers 66a, 66b, 66c, and 66d adapted to change the direction of travel of the substrate 11; the holders for the heating elements 86a-86h, and the cathodes 88a-88h connected to power supplies 92a-92h which are regulated by tuners 90a-90h. Further, and as described hereinafter, FIG. 7 adds, diagrammatically, (1) the pumping stations A-E adapted to exhaust the reaction gas mixtures from the chambers of the apparatus 26; and (2) a scrubber 148 for purifying those exhaust gas mixtures.

More particularly, five pumping stations are provided. The first pumping station A is operatively connected and adapted to direct exhaust gases from the supply chamber 50 of the apparatus 26 through a variable orifice valve 130a an on-off valve 130b and a line 130c into the pumping station A. The second pumping station B is operatively connected and adapted to direct exhaust gases from the first and fourth deposition chambers 28 and 34 through variable orifice valves 138a and 140a, respectively on-off valves 138b and 140b and line 139 into the pumping stations B. The third pumping station C is operatively connected and adapted to direct exhaust gases from the second and fifth deposition chambers 30 and 32 through variable orifice valves 142a and 144a, respectively on-off valves 142b and 144b, respectively and line 143 into the pumping stations C. The pumping station D is operatively connected and adapted to direct exhaust gases from the third and sixth deposition chambers 32 and 38 through variable orifice valves 132a and 134a, respectively. on-off valves 132b and 134b, respectively, and line 133 into the pumping station D. Finally, the pumping station E is operatively connected and adapted to direct exhaust gases from the take-up chamber 52 through a variable orifice valve 136a, on-off valve 136b, and a line 136c into the pumping station E.

Each of the pumping stations A-E includes filters, at least one blower for initial reduction of the pressure within the chambers of the apparatus 26 and at least one pump connected in series with the blower to reduce the vacuum pressure in the chambers to the desired level of approximately 0.5 torr. After passing through the pumping stations A-E, the exhausted reaction gas mixtures are introduced into a scrubber assembly 148 through individual conduits or through a common conduit 146. The scrubber 148 is adapted to purify the exhaust reaction gas mixtures drawn from the chambers prior to releasing same to the atmosphere. To this end, the noxious reaction gas mixtures are introduced into a fluid tank section 148a of the scrubber 148. The fluid therein is preferably a solution of sodium bicarbonate and water maintained at 1-2 pounds over atmospheric pressure. Obviously, other well known and commercially available purifying agents can be employed. A check valve 148b is provided in the event that it becomes necessary to shunt the noxious reaction gas mixtures directly to atmosphere.

Since it is essential, for effective deposition of alloy layers, that the vacuum pressures in the chambers of the apparatus 26 be maintained at selected levels, manometers are provided to constantly monitor vacuum pressures in the chambers. More particularly, a manometer $D_1$ is operatively connected to the pay-off, substrate-directing chamber 32 for sensing the pressure therein; a manometer $D_2$ is operatively connected to the first deposition chamber 28 for sensing the pressure therein; a manometer $D_3$ is operatively connected to the second deposition chamber 30 for sensing the pressure therein; a manometer $D_4$ is operatively connected to the third deposition chamber 32 for sensing the pressure therein; a manometer $D_5$ is operatively connected to the fourth deposition chamber 34 for sensing the pressure therein; a manometer $D_6$ is operatively connected to fifth deposition chamber 36 for sensing the pressure therein; a manometer $D_7$ is operatively connected to the sixth deposition chamber 38 for sensing the pressure therein; and a manometer $D_8$ is operatively connected to the post-deposition, substrate-directing chamber 44 for sensing the pressure therein.

A differential amplifier $DA_1$ is operatively connected to manometers $D_1$ and $D_2$ for measuring the pressure differential between the pay-off substrate-directing chamber 42 and the first deposition chamber 28; a differential amplifier $DA_2$ is operatively connected to manometers $D_2$ and $D_3$ for measuring the pressure differential between the first deposition chambers 28 and the second deposition chamber 30; a differential amplifier $DA_3$ is operatively connected to manometers $D_3$ and $D_4$ for measuring the pressure differential between the second deposition chamber 30 and the third deposition chamber 32; a differential amplifier $DA_4$ is operatively connected to manometers $D_4$ and $D_5$ for measuring the pressure differential between the third deposition chamber 32 and the fourth deposition chamber 34; a differential amplifier $DA_5$ is operatively connected to manometers $D_5$ and $D_6$ for measuring the pressure differential between the fourth deposition chamber 34 and the fifth deposition chamber 36; a differential manometer $DA_6$ is operatively connected to manometers $D_6$ and $D_7$ for measuring the pressure differential between the fifth deposition chamber 36 and the sixth deposition chamber 38; and a differential manometer $DA_7$ is operatively connected to manometers $D_7$ and $D_8$ for measuring the pressure differential between the sixth deposition chamber 38 and the post-deposition, substrate-directing chamber 44. The differential amplifers $DA_1$–$DA_7$ are operatively connected to electrical controls for operating the variable orifice valves 130a, 132a, 134a, 136a, 138a, 140a, 142a and 144a to insure the preselected pressure differentials between adjacent chambers of the apparatus 26 are maintained.

Finally, a vent valve 150a is connected to the second deposition chamber 30 and a vent valve 150b is connected to the fifth deposition chamber 36 to provide for the emergency exhaustion of reaction gas mixtures from the chambers of the apparatus 26.

G. The Electrical Stations

FIG. 8 is a diagrammatic representation of the multiple chambers which combine to form the apparatus 26 of the present invention showing, as described hereinabove: the gas gates 58a–58i; the substrate stretching from the supply core 60a on the supply mandril 60b to the take-up core 60c on the take-up mandril 60d; the idler rollers 66a, 66b, 66c, and 66d adapted to change the direction of travel of the substrate 11; the cathodes 88a–88i with the associated power supplies 92a–92h controlled by tuners 90a–90h; the pumping systems A–E for exhausting noxious reaction gas mixtures from the chambers to a scrubber 148; the process gas cabinet for storing the reaction gas cylinders 94a–94i; and the process gas manifold for mixing reaction gases and introducing the mixed reaction gases into the chambers of the apparatus 26. FIG. 8 adds, in black box form, an operator's console 150 and an electrical control cabinet 152.

The operator's control console 150 includes drive motor controls; automatic threader controls; interleaf controls, substrate speed indicators and controls; substrate tension indicators and controls; radio frequency generator controls; alloy layer thickness monitors; and controls spectrometer controls; vacuum pressure controls; reaction gas flow controls; reactions gas mixing controls; and on-off switches.

The electrical control cabinet 152 includes a main disconnect switch, fuses, transformers, heater controls, motor starters, and sequence interlock controls. It is unnecessary to detail the circuitry for connecting the controls housed in the operators console 150 and the electrical control cabinet 152 to the mechanisms for monitoring, indicating and controlling the operation of the assembly 26. Such electrical controls are well within the ability of the ordinarily skilled artisan and in and of themselves are insignificant to the operation the present invention.

III. The Operational Sequence

The apparatus 26 comprising all of the chambers and all of the assemblies, described hereinabove in the foregoing description of FIGS. 2–7, necessary to effectuate the continuous production of stacked, amorphous, photovoltaic solar cells on a continuous web of substrate material 11 requires the performance of at least the following steps:

(1) The core 60a about which the web of substrate material 11 is wound, is loaded onto the expandable pay-off mandril 60b housed within the pay-off chamber 50 of the apparatus 26;

(2) The core of substrate 60a is centered on the pay-off mandril 60b and locked in place thereon by expanding the circumference of pay-off mandril 60b;

(3) The leading edge of the web of substrate material 11 is wound about the links 62n, 62p and 62q of the flexible belt 62g of the automatic threading assembly 62;

(4) The automatic threading assembly 62 is energized by activating the motor 62a positioned adjacent the pay-off mandril 60b and the motor 62d positioned adjacent the pick-up mandril 60d. The substrate 11 is thereby threaded about idler rollers 66a and 66b, through the passageways 80 in the gas gates 58a–58j; about idler rollers 66c and 66d, through slots 68a and 68b to the take-up roller 62f located adjacent the take-up mandril 60d in the take-up chamber 52. The strip is detached from the flexible belt 62d of the automatic threading assembly 60 and taped to the empty core 60c which is locked in a centered position on the take-up mandril 60d;

(5) The optional interleaf removal and take-up assembly 64 is implemented by securing the interleaf sheeting 64d from between adjacent layers of the fresh substrate core 60a on the supply mandril 60b to the interleaf removal roller 64a positioned adjacent the supply mandril 60b in the pay-off chamber 50. The replacement interleaf sheeting 64d wound about the interleaf introduction roller 64e is secured to the substrate 11 on the take-up core 60c centered on the take-up mandril 60d in the take-up chamber 52 for introducing interleaf sheeting 64d between adjacent layers of substrate 11 as the substrate 11 is wound about the take-up core 60c;

(6) All of the chambers of the apparatus 26 are sealed in preparation for vacuum pumping;

(7) The pumping systems A–E are activated to begin vacuumizing the apparatus 26 to the desired vacuum pressures;

(8) All of the heating elements, both the resistance heaters 84 in the gas gates 58a–58j and the holders for the heating elements, such as infrared lights, 86a–86h in the chambers of the apparatus 26 are energized during the vacuumizing operation, but only after the pumping systems A–E have been activated;

(9) Argon gas from container 94j is introduced into all of the chambers of the apparatus 26 to flush same;

(10) The argon and hydrogen gases are mixed and the flow rate thereof is set for cleaning the plasma in the cleaning chamber 46. The proportion of reaction gas mixtures and gas flow rates are set for mixing and introducing the reaction gas mixtures into the first deposition chamber 28, the second deposition chamber 30, the third deposition chamber 32, the intermediate isolation chamber 40, the fourth deposition chamber 34, the fifth deposition chamber 36, the sixth deposition chamber 38, and the post-deposition, substrate-directing chamber 44;

(11) The radio frequency power supplies 92a–92h are energized and the tuners 90a–90h thereof are set to activate the cathodes 88a–88h at the desired power levels;

(12) The substrate supply and take-up assembly 60 is activated by energizing the supply drive motor 60g, the substrate-tensioning motor 66g, the take-up idler motor 66a and the take-up drive motor 60e;

(13) The assembly 26 will begin processing the web of substrate material 11 at a rate of approximately one (1) foot per minute, to automatically and continuously deposit successive layers of amorphous silicon alloys thereonto by setting the temperature controllers 88, the speed controllers 60, the tension controllers 66, the radio frequency tuners 90 to maintain preset operating parameters;

(14) When the end of the web of substrate material 11 has been reached, the substrate unload cycle is activated;

(15) The mandril 60d about which the core of substrate material 11 is wound is stopped;

(16) The introduction of reaction gas mixtures is halted; argon gas is introduced into all of the chambers of the apparatus 26 from the argon gas cylinder 94j to flush the chambers, starting simultaneously in the second deposition chamber 30, the fifth deposition chamber 36 and the intermediate isolation chamber 40. The argon gas is subsequently introduced into all of the other chambers while maintaining the pressure differentials therebetween so as to prevent the flow of the p-type dopant and n-type dopant into the intrinsic deposition chambers;

(17) The resistance heaters 84 in the gas gates 58a–58j, the holders for heating elements 86a–86h the chambers of the apparatus 26, and the pumping systems A–E are disabled;

(18) The vent valves 150a–150b are energized and the web of substrate material 11 is forwarded to complete winding of same about the take-up core 62c on the take-up mandril 60d in the take-up chamber 52;

(19) The chambers of the apparatus 26 are opened to the environment;

(20) The circumference of the take-up mandril 60d and the supply mandril 60b are relaxed and the take-up core 60c and the supply core 60a are removed therefrom;

(21) The filters are checked and cleaned; and

(22) A fresh core 60a of substrate 11 is centered onto the pay-off mandril 60b.

While for purposes of illustration, a preferred embodiment of the invention has been disclosed, other forms and embodiments thereof may become readily apparent to those ordinarily skilled in the art upon reference to this disclosure and, therefore, this invention is intended to be limited only by the scope of the appended claims.

What we claim for U.S. Letters Patent is:

1. A multiple chamber deposition apparatus for continuously producing tandem, amorphous, photovoltaic cells; each cell having a total cell thickness of at least two tri-layered units, each unit including one p-type layer and one n-type layer operatively disposed on opposite sides of an intermediate intrinsic layer; said apparatus comprising, in combination:
   substrate material;
   a pay-off chamber including a pay-off mandril;
   a substrate cleaning chamber;
   sources of cleaning gases;
   means for introducing the cleaning gases into the cleaning chamber for cleaning the substrate;
   a triad of deposition chambers for each tri-layered unit of the tandem cells; the deposition chambers arranged sequentially for the deposition of the p-type and n-type layers at the ends of each triad sequence and for the deposition of the intrinsic layer between the p-type and n-type layers of each triad sequence to provide three deposition layers for each cell unit;
   a take-up chamber including a take-up mandril;
   a source of interleaf sheeting for positioning between adjacent layers of substrate material as the substrate material is wound about the take-up mandril;
   means for vacuumizing the apparatus;
   means for heating the deposition chambers and the substrate;
   automatic threading means adapted to deliver the leading edge of the substrate material from the pay-off mandril to the take-up mandril;
   means for continuously moving the substrate material from the pay-off mandril through the cleaning chamber and each triad of deposition chambers to the take-up mandril;
   means for depositing the successive layers of the tri-layered units upon the substrate material or previously deposited layers;
   sources of reaction gases which include semiconductor precursor gases and dopant precursor gases;
   means operatively associated with each chamber of each triad of deposition chambers for introducing a preselected reaction gas mixture thereinto;
   a gas gate operatively disposed between each pair of deposition chambers of the triads;
   a source of sweep gas for the gas gates;
   means adapted to introduce sweep gas into the gas gates for substantially isolating the reaction gas mixture in the second chamber of each triad of chambers from the reaction gas mixtures in the first and third chambers of said triad of chambers;
   a discrete isolation chamber disposed between the third chamber of one triad of chambers and the first chamber of the succeeding triad of chambers;
   sources of isolation gases;
   means for introducing an isolation gas mixture into said isolation chamber, means associated with said isolation chamber for providing a unidirectional flow of gas therefrom into said third chamber of one triad and said first chamber of the succeeding triad, so as to substantially prevent cross contamination of the respective gas mixtures therein; and,
   means for substantially maintaining the preset substrate temperature, speed of substrate travel, substrate tension, mixtures of reaction gases in each deposition chamber, mixtures of isolation gases in the isolation chamber, sweep gas in the gas gates, pressure differentials between adjacent chambers, and vacuum pressures; whereby, high quality tandem photovoltaic cells are continuously produced on the substrate material.

2. Apparatus as in claim 1, wherein each triad of deposition chambers is arranged substantially in a horizontal line, the substrate material being an elongated web adapted to extend through each triad of deposition chambers;
   supply means for the web of substrate material are provided adjacent one end of the horizontal line; and
   take-up means for the web of substrate material are provided adjacent the other end of said horizontal line.

3. Apparatus as in claim 2, wherein two tri-layered cells units are deposited on the web of substrate material, with the second tri-layered unit superposed on the first tri-layered unit; and
   six deposition chambers arranged in sequential order extend from adjacent the supply means to adjacent the take-up means; and
   the reaction gas mixtures include a first gas mixture provided for the first and fourth deposition chambers, a second gas mixture provided for the second and fifth deposition chambers, and a third gas mixture provided for the third and sixth deposition chambers.

4. Apparatus as in claim 1, wherein at least a silicon alloy is introduced into the second and fifth deposition chambers; at least a silicon alloy and a p-type dopant are introduced into the first and fourth deposition chambers; and at least a silicon alloy and an n-type dopant are introduced into the third and sixth deposition chambers.

5. Apparatus as in claim 1, further including means for purging each of the deposition chambers and the isolation chamber by introducing gaseous nitrogen thereinto.

6. Apparatus as in claim 1, wherein the cleaning means includes means for introducing argon and hydrogen into the cleaning chamber.

7. Apparatus as in claim 1, wherein the supply chamber further includes a pay-off idler roller for directing the substrate material toward the first deposition chamber; and the take-up chamber further includes a take-up idler roller for directing the substrate material toward the take-up mandril.

8. Apparatus as in claim 7, wherein individual motors are provided for driving the pay-off mandril, the pay-off idler roller and the take-up idler roller; and the means for rotating the take-up mandril is a motor.

9. Apparatus as in claim 8, wherein the motors are selectively adjustable for moving the substrate material through the chambers under tension so as to eliminate waffling and canoeing of the substrate.

10. Apparatus as in claim 9, wherein the substrate material is moved through the deposition chambers at a substantially constant rate of speed of approximately 1 foot per minute and under an operating tension of approximately 10 pounds per square inch.

11. An apparatus as in claim 1, wherein the web of substrate material is trained about a first turning roller positioned ahead of the horizontal line of deposition chambers for directing the substrate material to the first deposition chamber; and the web of substrate material is trained about a second turning roller positioned after the horizontal line of deposition chambers for directing the substrate material to the take-up idler roller;

the first turning roller housed within a pay-off, substrate-directing chamber located between and operatively connected to the first deposition chamber and the cleaning chamber; and the second turning roller housed within a post-deposition, substrate-directing chamber operatively connected to the sixth deposition chamber.

12. Apparatus as in claim 11, further including a cool-down chamber operatively connected to and positioned between the post-deposition, substrate-directing chamber and the take up chamber for cooling the substrate material prior to winding the substrate material about the take-up core.

13. Apparatus as in claim 11, wherein the web of substrate material that extends between the first and second turning rollers assumes a shallow sag; and the elevation of the pay-off, substrate-directing chamber, the isolation chamber, the post-deposition, substrate-directing chamber, and the deposition chambers are sequentially staggered to accomodate the shallow sag of the web of substrate material.

14. Apparatus as in claim 12, wherein all of the chambers are maintained at a vacuum pressure of about 0.5 torr.

15. Apparatus as in claim 1, wherein the gas gates include a plurality of heating elements for maintaining the elevated temperature of the substrate as it passes between chambers.

16. Apparatus as in claim 15, wherein each heating element is connected to a power supply, a thermocouple and a thermocouple controller, whereby the temperature of the substrate material in each heated chamber can be individually monitored and controlled.

17. Apparatus as in claim 15, wherein the temperature in the deposition chambers is maintained in the range of approximately 200–300 degrees Centigrade.

18. Apparatus as in claim 1, wherein the depositing means comprises glow discharge deposition means which includes a cathode, a radio frequency generator and a tuner, whereby the reaction gas mixtures are disassociated into elemental forms.

19. Apparatus as in claim 18, wherein the cleaning chamber also includes a cathode, a radio frequency generator and a tuner.

20. Apparatus as in claim 18, wherein the cathode in the first deposition chamber is about 30 inches in length; the cathode in the second deposition chamber is about 100 inches in length; the cathode in the third and fourth deposition chambers are about 12 inches in length; the cathode in the fifth deposition chamber is about 30 inches in length; the cathode in the sixth chamber is about 12 inches in length; and the cathode in the cleaning chamber is about 25 inches in length.

21. Apparatus as in claim 20, wherein the cathode in the second deposition chamber comprises two individual cathodes, each cathode connected to an individual radio frequency generator and an individual tuner.

* * * * *